(12) United States Patent
Andreev et al.

(10) Patent No.: US 7,949,909 B2
(45) Date of Patent: May 24, 2011

(54) ADDRESS CONTROLLING IN THE MBIST CHAIN ARCHITECTURE

(75) Inventors: Alexandre Andreev, San Jose, CA (US); Anatoli Bolotov, Cupertino, CA (US); Mikhail Grinchuk, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 306 days.

(21) Appl. No.: 12/183,562

(22) Filed: Jul. 31, 2008

(65) Prior Publication Data

US 2009/0300441 A1    Dec. 3, 2009

Related U.S. Application Data

(60) Provisional application No. 61/056,172, filed on May 27, 2008, provisional application No. 61/056,246, filed on May 27, 2008, provisional application No. 61/059,882, filed on Jun. 9, 2008.

(51) Int. Cl.
*G11C 29/00* (2006.01)
*G01R 31/28* (2006.01)

(52) U.S. Cl. ........ 714/718; 714/719; 714/720; 714/724; 714/733; 365/201

(58) Field of Classification Search .................... None
See application file for complete search history.

(56) References Cited

U.S. PATENT DOCUMENTS

| | | | |
|---|---|---|---|
| 4,517,512 A | 5/1985 | Petrich et al. | 324/73 R |
| 4,929,889 A | 5/1990 | Seiler et al. | 371/22.3 |
| 5,051,997 A | 9/1991 | Sakashita et al. | 371/22.4 |
| 5,742,557 A | 4/1998 | Gibbins et al. | 365/230.05 |
| 5,896,330 A | 4/1999 | Gibson | 365/201 |
| 6,014,336 A | 1/2000 | Powell et al. | 365/201 |
| 6,070,256 A | 5/2000 | Wu et al. | 714/718 |
| 6,288,969 B1 | 9/2001 | Gibbins et al. | 365/230.05 |
| 6,347,056 B1 * | 2/2002 | Ledford et al. | 365/201 |
| 6,681,358 B1 | 1/2004 | Karimi et al. | 714/733 |
| 6,941,494 B1 * | 9/2005 | Andreev et al. | 714/718 |
| 7,010,736 B1 * | 3/2006 | Teh et al. | 714/733 |
| 7,028,240 B1 | 4/2006 | Bautista, Jr. et al. | 714/733 |
| 7,062,694 B2 | 6/2006 | Caty et al. | 714/733 |
| 7,139,204 B1 | 11/2006 | Behera | 365/201 |
| 7,653,854 B2 | 1/2010 | Anzou et al. | 714/733 |
| 7,773,439 B2 | 8/2010 | Do et al. | 365/201 |
| 2002/0104051 A1 | 8/2002 | Gupta | 714/733 |
| 2002/0174394 A1 * | 11/2002 | Ledford et al. | 714/733 |
| 2002/0188902 A1 * | 12/2002 | Fan et al. | 714/724 |
| 2004/0181303 A1 | 9/2004 | Walmsley | 700/115 |
| 2005/0028058 A1 | 2/2005 | Perner | 714/718 |
| 2005/0138514 A1 | 6/2005 | Burdine et al. | 714/733 |
| 2005/0246602 A1 | 11/2005 | Bahl et al. | 714/733 |
| 2006/0156134 A1 * | 7/2006 | Mukherjee et al. | 714/733 |
| 2006/0242521 A1 | 10/2006 | Hii et al. | 714/733 |
| 2007/0220389 A1 | 9/2007 | Sato | 714/733 |
| 2008/0077834 A1 | 3/2008 | Khoche et al. | 714/732 |
| 2008/0282119 A1 | 11/2008 | Suzuki et al. | 714/718 |

* cited by examiner

*Primary Examiner* — Robert Beausoliel
*Assistant Examiner* — Guerrier Merant
(74) *Attorney, Agent, or Firm* — Christopher P. Maiorana, PC

(57) ABSTRACT

A memory collar includes a first circuit, a second circuit and a third circuit. The first circuit may be configured to generate a first control signal, a second control signal and a third control signal in response to one or more test commands. The second circuit may be configured to generate a fourth control signal in response to said third control signal and the fourth control signal. The third circuit may be configured to generate one or more address sequences. The one or more address sequences are presented to a memory during a test mode.

22 Claims, 12 Drawing Sheets

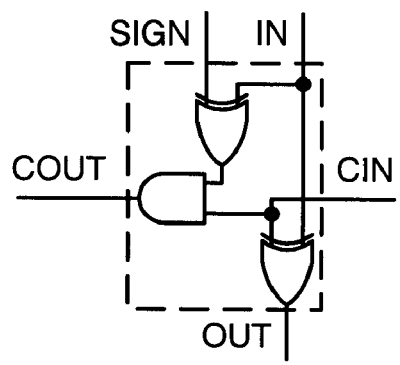
(A)
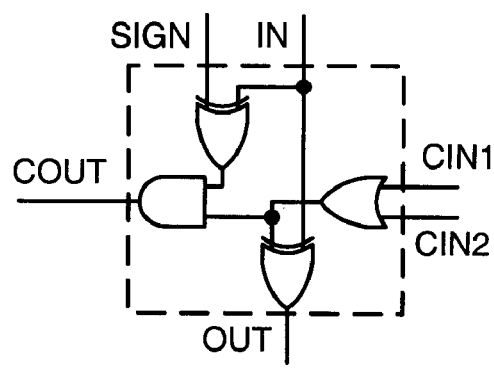
(B)
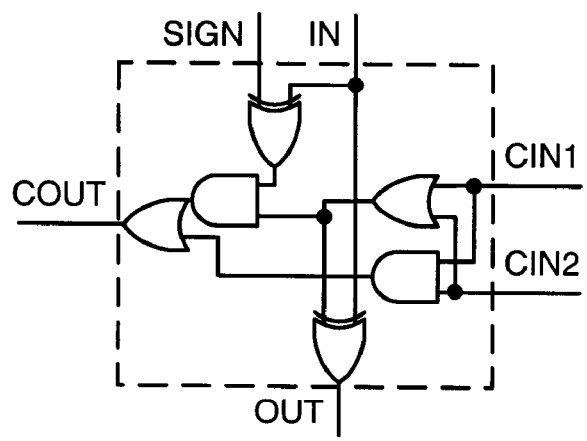
(C)
FIG. 5

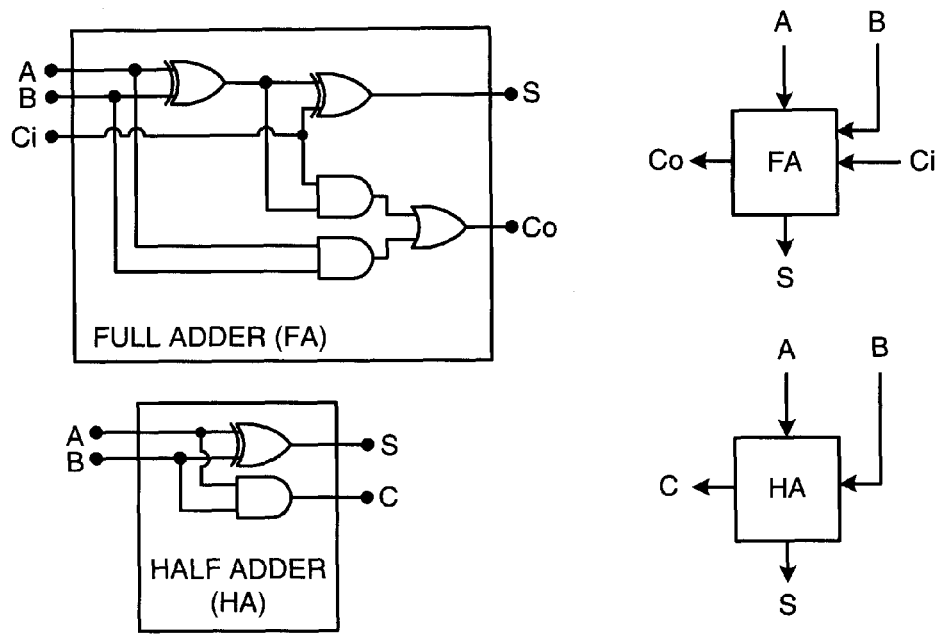
FIG. 8
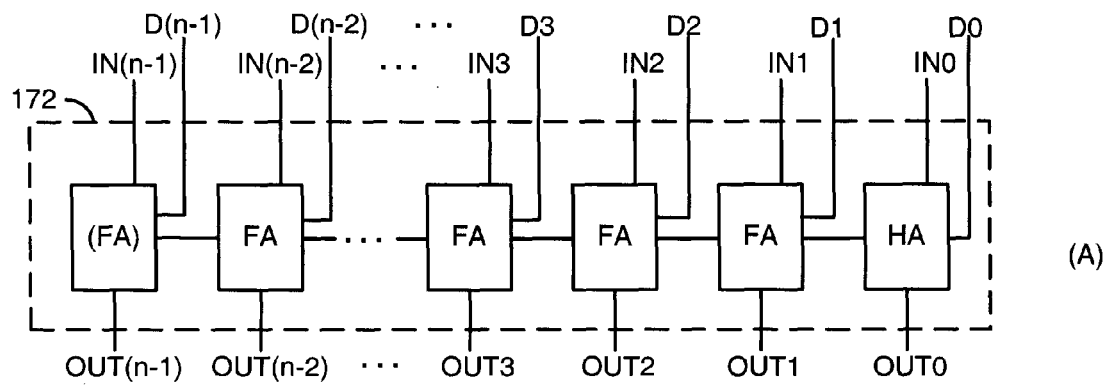
(A)
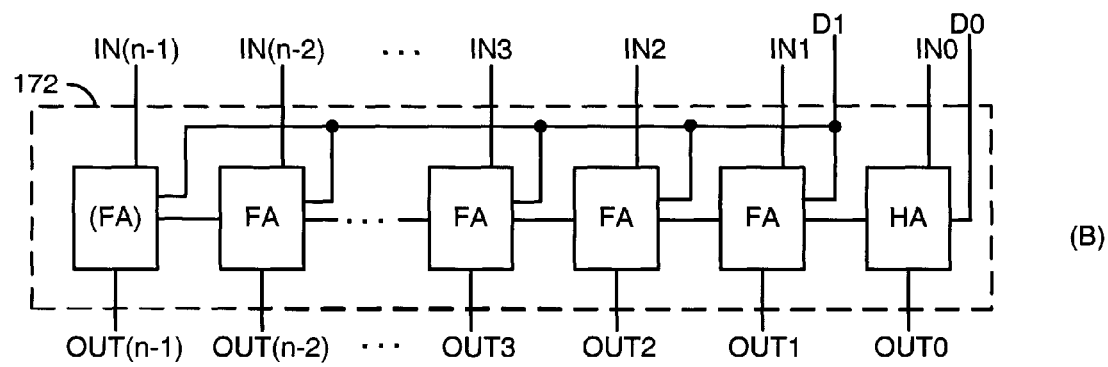
(B)
FIG. 9

ADDRESS CONTROLLING IN THE MBIST CHAIN ARCHITECTURE

This application claims the benefit of U.S. Provisional Application Nos. 61/056,172 and 61/056,246, filed May 27, 2008, and 61/059,882, filed Jun. 9, 2008, which are hereby incorporated by reference in their entirety.

FIELD OF THE INVENTION

The present invention relates to memory architectures generally and, more particularly, to a method and/or apparatus for implementing address control in the MBIST chain architecture.

BACKGROUND OF THE INVENTION

Conventional methods for at-speed parallel built-in self test (BIST) for memories of different types involve (i) separate MBIST controllers for each memory, (ii) parallel testing of (almost) identical memories with partial data compressing, (iii) shared controllers, but testing memories one-by-one and (iv) testing memories in the same way as regular logic. The conventional techniques have disadvantages including (i) a large number of gates, (ii) wide interconnection busses, (iii) placement limitations (i.e., controllers must be placed near memories), (iv) slow testing and (v) non-reusable BIST solutions for each new memory vendor.

SUMMARY OF THE INVENTION

The present invention concerns a memory collar including a first circuit, a second circuit and a third circuit. The first circuit may be configured to generate a first control signal, a second control signal and a third control signal in response to one or more test commands. The second circuit may be configured to generate a fourth control signal in response to said third control signal and the fourth control signal. The third circuit may be configured to generate one or more address sequences. The one or more address sequences are presented to a memory during a test mode.

The objects, features and advantages of the present invention include providing a method and/or apparatus for controlling addresses in a MBIST chain architecture that may (i) provide at-speed on-chip memory testing, (ii) provide parallel testing of a wide variety of memories, (iii) provide built-in support of testing and diagnostic operation modes, (iv) be easily implemented, (v) provide flexibility to make extensions for new tests and/or types of memories, (vi) allow parallel testing of all memories with single controller, (vii) use moderate width busses (e.g., 8-10 bits wide) for connecting the controller with collars, (viii) implement pipelined busses, (ix) provide suppression of signal distortion by allowing insertion of extra flip-flops, (x) use data encoding to allow at-speed testing of memories, (xi) allow new tests and new memory types to be added easily and often without influence on earlier designed components, (xii) provide low complexity of memory collars connected to memories, (xiii) support different testing and/or diagnostic modes (e.g., testing memories for correctness, testing particular output bit of a particular memory, observe the data sequence of the particular bit, etc.) and/or (xiv) be reused for built-in self repair (BISR) solutions.

BRIEF DESCRIPTION OF THE DRAWINGS

These and other objects, features and advantages of the present invention will be apparent from the following detailed description and the appended claims and drawings in which:

FIGS. 5(A-C) are diagrams illustrating a variety of 1-bit slices of the incrementor/decrementor of FIG. 4;

FIG. 8 is a diagram illustrating full adder and half adder circuits;

FIGS. 9(A-B) are diagrams illustrating arithmetic circuits implemented with full adders and half adders;

DETAILED DESCRIPTION OF THE PREFERRED EMBODIMENTS

Testing of VLSI designs becomes more and more difficult as designs grow in complexity. Testing should be very accurate to reduce the number of non-detected faults. Testing should also be fast and inexpensive in terms of hardware and software overhead. Testing memories is an especially important task, because to reduce memory sizes, gates and wires are typically placed very densely. Densely placing gates and wires may result in a significantly higher (up to 4 times) ratio of faults. Because memories are very regular structures, testing may be done on-chip, based on data sequences generated by relatively small processors. Such a processor may, for example, produce data and address sequences (like well-known march test sequences), check output signals of the memory and produce error reports and/or reconfiguration information to be used in, for example, a self-repair mode.

To reduce circuitry overhead and testing time, one test processor may send test data to multiple memories in parallel. A processor implemented in accordance with the present invention generally satisfies the following conditions: 1) the sequence of test data is memory-invariant (e.g., the same data may be sent to memories of different sizes and configurations, even to memories generated by different compilers); 2) test data may go through a "narrow" channel in a packed form using an encoding such that memories may be tested "at speed"; 3) decoding is generally simple (e.g., both fast and employing a moderate number of gates).

The present invention generally provides a method of parallel address manipulations in memory collars and in the built-in test controller. In one example, the present invention may be implemented as an address controlling subsystem. The present invention may allow individual memory circuits, or subsets of memory circuits, to be tested and/or operated using a common controller.

Figure 1:
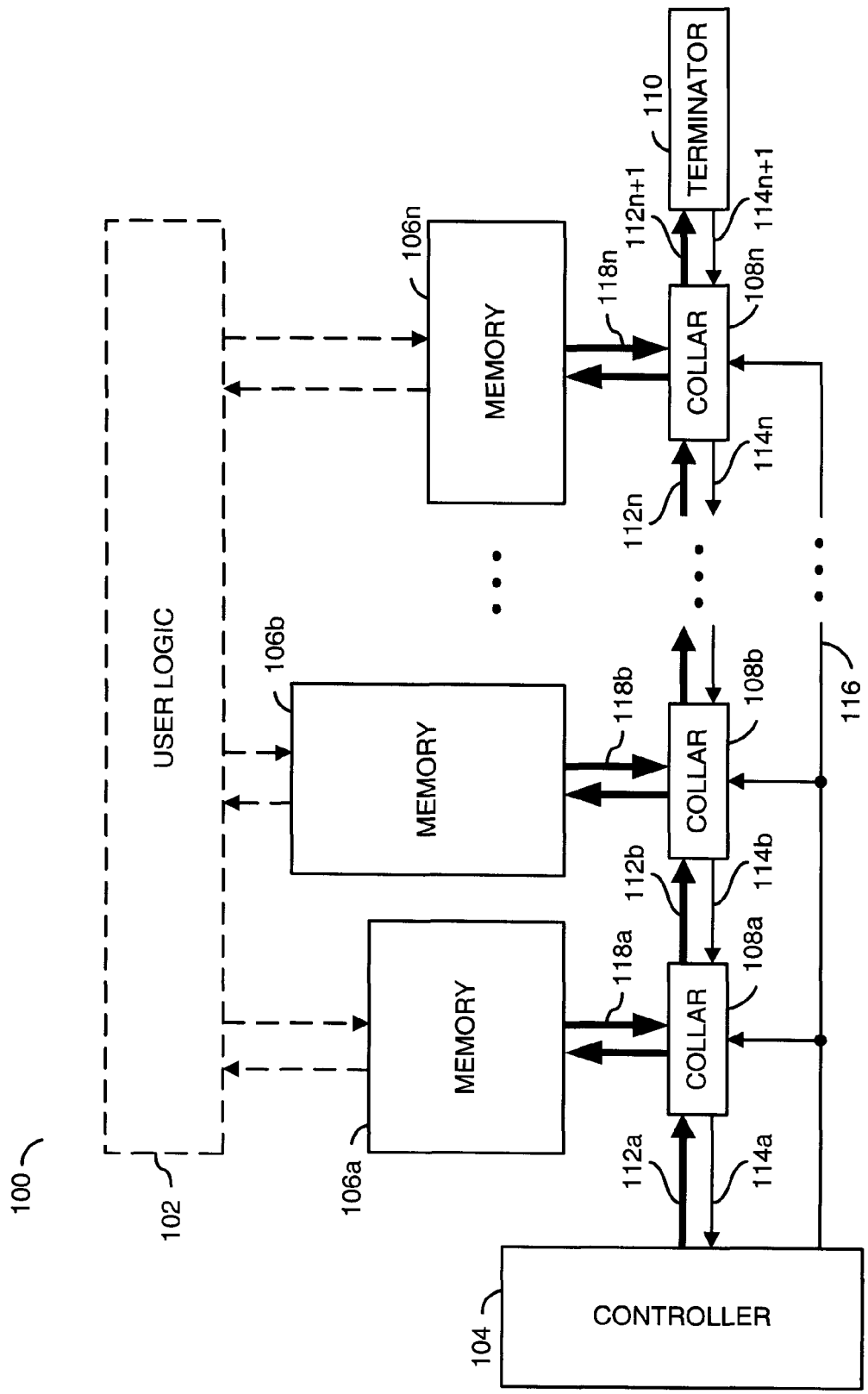
FIG. 1 is a block diagram illustrating a MBIST chain architecture in which the present invention may be implemented.

Referring to FIG. 1, a block diagram is shown illustrating a system 100 implementing a transport subsystem in accordance with a preferred embodiment of the present invention. The system 100 generally comprises a block (or circuit) 102, a block (or circuit) 104, a number of blocks (or circuits) 106a-106n, a number of blocks (or circuits) 108a-108n and a block (or circuit) 110. In one example, the circuit 102 may be implemented as a user logic circuit. The circuit 104 may be implemented as a controller circuit. The circuits 106a-106n may be implemented as memory circuits. The circuits 108a-108n may be implemented as memory collar circuits. The circuit 110 may be implemented as a terminator circuit. In one example, the controller circuit 104 may be implemented as a BIST circuit. The controller circuit 104 may be a common controller used with each of the memory circuits 106a-106n.

The memory circuits 106a-106n may be on the same integrated circuit as, or on separate integrated circuits from, the memory collar circuits 108a-108n. For example, the memory circuits 106a-106n may be integrated on an integrated circuit along with the memory collar circuits 108a-108n. Alternately, sockets (not shown) may be implemented between the memory circuits 106a-106n and the memory collar circuits 108a-108n. With sockets, a number of different memory circuits 106a-106n may be connected to each of the memory collar circuits 108a-108n.

The system 100 may be implemented as a memory built-in self-test (MBIST) chain architecture. For example, the memory circuits 106a-106n may be coupled to form a chain. A number of busses 112a-112n, a number of busses 114a-114n and a bus 116 may be implemented coupling the controller 104 and the memory collar circuits 108a-108n. The busses 112a-112n may be implemented, in one example, having a moderate width (e.g., 8-10 bits). The busses 114a-114n and the bus 116 may be implemented, in one example, as single-bit busses. However, other bit-widths may also be implemented. The busses 112a-112n and 114a-114n may couple the memory collar circuits 108a-108n to form a pipelined chain. The controller 104 may be connected to one end of the chain via the busses 112a, 114a and 116. The terminator circuit 110 may be coupled to another end of the chain via a bus 112n+1 and a bus 114n+1. The busses 112n+1 and 114n+1 may be configured similarly to the busses 112a-112n and 114a-114n, respectively.

Each of the memory collar circuits 108a-108n may be configured to operate with a particular one of the memory circuits 106a-106n. The memory collar circuits 108a-108n may be implemented to allow the various memory circuits 106a-106n to operate with the common controller 104. For example, the collar 108a may operate with the memory 106a, the collar 108b may operate with the memory 106b, etc. The structures and/or size of the memories 106a-106n may be varied to meet the design criteria of a particular implementation. For example, a customer may specify a 4-port memory having 1024 words×128 bits, plus a 1-port memory having 1M words×16 bits, plus a 3-port memory having 16K×36 bits with two ports for reading and 1 port for writing, etc.

When the memories have been specified, an engineer (or designer) may prepare the controller 104 and the collars 108a-108n to support adequate testing protocols. The engineer may run a process (e.g., using computer aided design, or CAD software) to design a part of a netlist (e.g., text in Verilog or other hardware description language) corresponding to the controller 104 and collars 108a-108n. The netlist may be incorporated into the customer's design. With the netlist incorporated in to the design, the design may be transformed by multiple tools and become a set of photo masks for chip fabrication. The present invention allows the addition of test capability without altering the memories 106a-106n and/or the user logic 102.

The present invention may provide custom generation of the memory collar circuits 108a-108n and the controller 104 to test the customer specified memories. In general, the parameters of the memory circuits 106a-106n are known in advance. The length of particular busses 112a-112n and 114a-114n connecting the neighboring collars 108a-108n (or to the controller 104 and the nearest one of the collars 108a-108n) is not generally a critical parameter and may be varied. For example, the system 100 may be implemented on a single integrated circuit chip, on multiple separate integrated circuit chips, or with fully non-integrated elements (e.g., vacuum tubes, electromagnetic switches, etc.). The MBIST chain architecture generally permits splitting long connections into smaller pieces by adding flip-flop boundaries between the connections.

The bus 116 may be implemented, in one example, as a 1-bit bus. A set of 1-bit mode selection signals (e.g., TEST/USER MODE SELECTION) may be sent to each of the memory collar circuits 108a-108n via the bus 116. For example, a first value (e.g., 0) may indicate a user mode and a second value (e.g., 1) may indicate a test mode. In the user mode, the collars 108a-108n may be "switched off" and the connections between the memories 106a-106n and the user logic 102 may be enabled. In the test mode, the connections between the memories 106a-106n and the user logic 102 may be disabled, and the connections between the memories 106a-106n and the memory collar circuits 108a-108n may be enabled. The memory collar circuits 108a-108n may send read/write commands, addresses and data to the memories 106a-106n through a number of busses 118a-118n. The busses 118a-118n may be implemented, for example, as bi-directional busses, a set of uni-directional busses, or a combination of bi-directional and uni-directional busses. The memory collar circuits 108a-108n may also receive values that may be output by or read from the memories 106a-106n through the busses 118a-118n.

The present invention may be implemented as part of a MBIST chain architecture. The architecture may include the controller 104, collars 108a-108n and the busses connecting the collars into a pipelined chain with the controller 104 on one side and the terminator unit 110 on the other side. The busses may be, in one example, of moderate width (e.g., about 8-10 bits). Each of the collars 108a-108n may operate with a single respective memory unit 106a-106n. Structures and sizes of the memories 106a-106n may differ.

Figure 2:
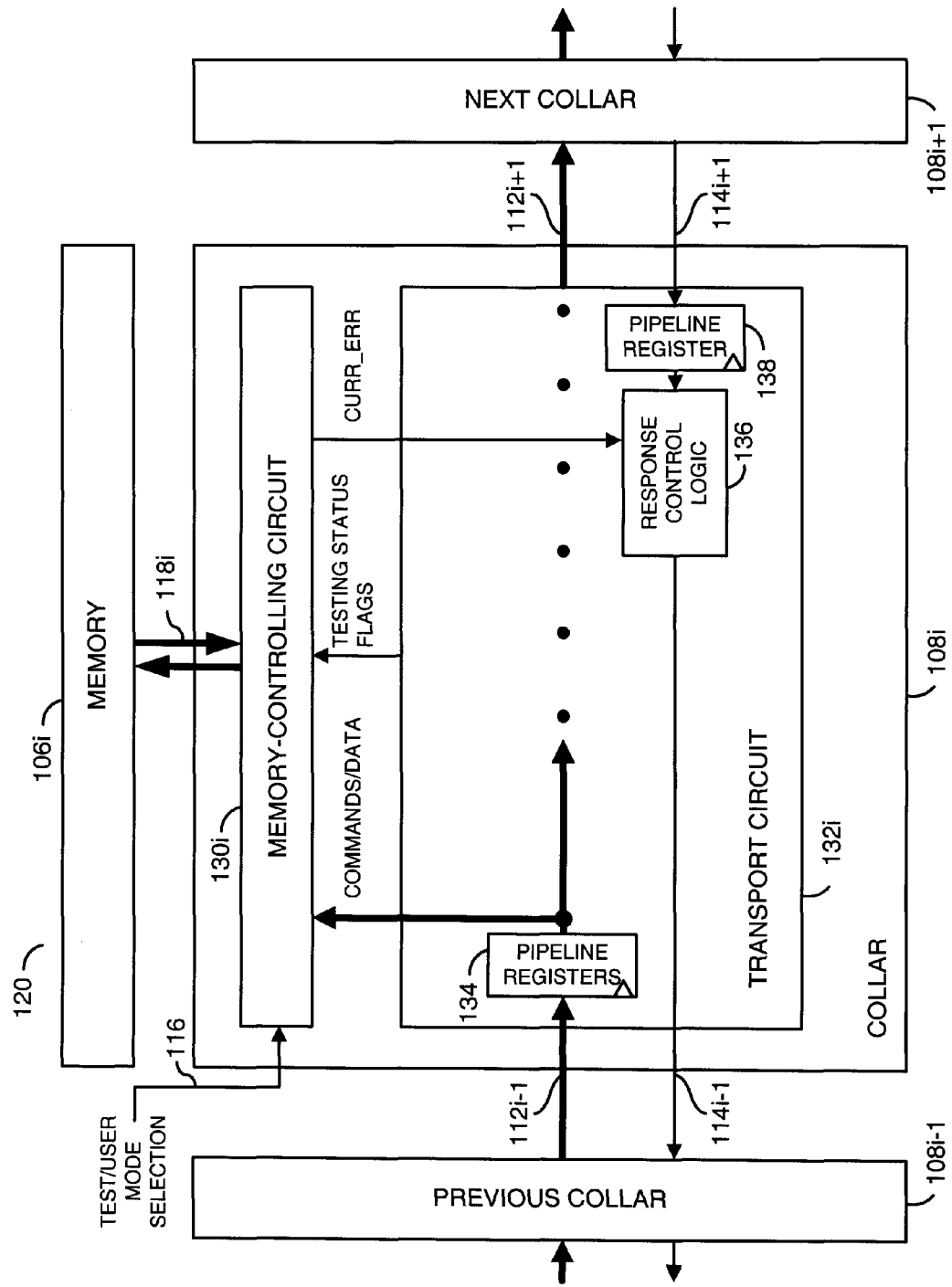
FIG. 2 is a block diagram illustrating a memory collar in accordance with an embodiment of the present invention.

Referring to FIG. 2, a detailed diagram is shown illustrating a subsystem 120. The subsystem 120 may be implemented as part of the MBIST chain architecture 100. The subsystem 120 generally illustrates a number of interconnection busses and/or components of an example collar 108i. The subsystem 120 generally performs functions including (i) transmitting commands from the controller 104 to an individual memory 106i and (ii) reading back data from the individual memory 106i to the controller 104.

The collar 108i may comprise, in one example, a block (or circuit) 130i and a block (or circuit) 132i. The circuit 130i and the circuit 132i may be relatively independently operating parts (or sub-modules). The circuit 130i may be implemented as a memory-controlling portion (MCP) of the collar 108i. The circuit 132i may be implemented as a transport portion (TP) of the collar 108i. The circuit 130i and the circuit 132i may be implemented as finite state machines (FSMs). For example, the circuit 130i and the circuit 132i may include a number of internal storage elements (e.g., flip-flops, registers, etc.). Each of the collars 108a-108n may be implemented similarly to the collar 108i (e.g., with a respective memory-controlling portion 130a-130n and a respective transport portion 132a-132n).

The memory-controlling portion (MCP) 130i of each of the collars 108a-108n generally interprets the test commands, prepares input signals for the memory under test, checks the outputs from the memory under test and produces 1-bit output signals. The MCP 130i may comprise a combination of sub-units. The present invention generally describes subunits of the MCP 130i that are responsible for generating addresses to be sent to a corresponding memory.

The transport portion (TP) 132i of each of the collars 108a-108n may be responsible for transmitting test commands along the chain, setting test status of the individual memories 106a-106n (e.g., do not test/test all outputs/test only one output bit, etc.) and collecting and returning the status (e.g., good/faulty) of the individual memories 106a-106n.

The memory-controlling portion 130i may have an input/output that may interface with the memory 106i via the bus 118i, a first input that may receive the signal TEST/USER MODE SELECTION, a second input that may receive commands and data (e.g., COMMANDS/DATA), a third input that may receive one or more control signals (e.g., TESTING STATUS FLAGS) and an output that may present a signal (e.g., CURR_ERR). In one example, the interface between the block 130i and the memory 106i may be implemented as a bi-directional bus. In another example, the interface between the block 130i and the memory 106i may be implemented as separate input and output busses. However, other appropriate interfaces may be implemented between the block 130i and the memory 106i to meet the design criteria of a particular implementation.

The transport portion 132i generally comprises a block (or circuit) 134, a block (or circuit) 136 and a block (or circuit) 138. The circuits 134 and 138 may be implemented, in one example, as registers. The circuit 136 may be implemented as a response control logic. The block 134 may be configured to latch commands and data (e.g., COMMANDS/DATA) received from a previous sub-module (e.g., a collar 108(i−1) or the controller 104) for presentation to the circuit 130i and a next collar 108(i+1). The block 136 may be configured to receive (i) the signal CURR_ERR from the block 130i and (ii) an output of the block 138. The block 136 may be further configured to present an output to the previous sub-module 108(i−1). The block 136 may be configured to generate the output in response to the signal CURR_ERR and the output of the block 138. The block 138 may be configured to latch a signal received from the next sub-module (e.g., a collar 108(i+1)). The block 132i may include further control logic (or circuitry), not shown, that may be configured to generate the one or more control signals TESTING STATUS FLAGS.

Figure 3:
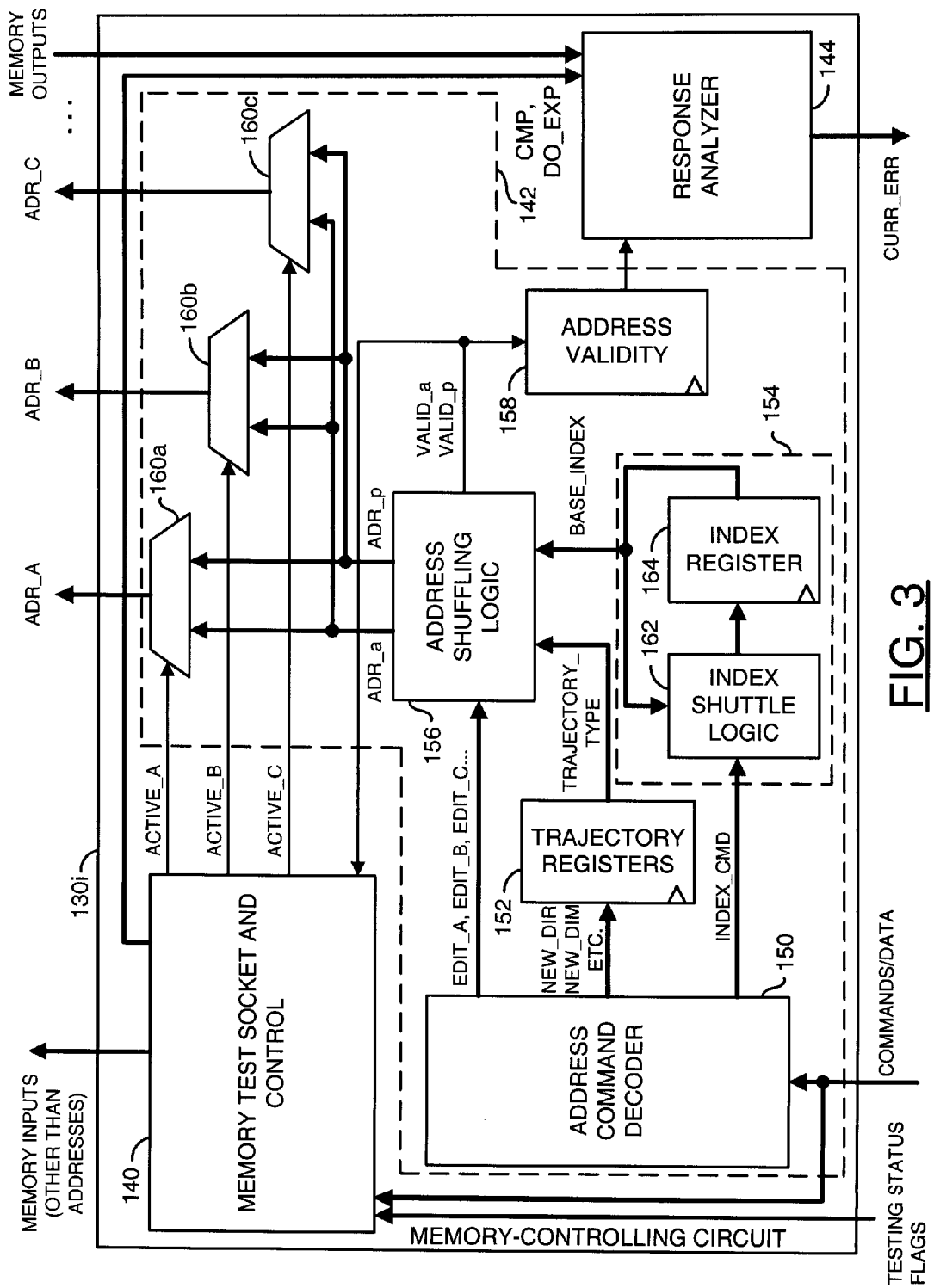
FIG. 3 is a block diagram illustrating a memory-controlling portion of the memory collar of FIG. 2.

Referring to FIG. 3, a diagram is shown illustrating an example memory-controlling portion 130i implemented in accordance with a preferred embodiment of the present invention. The memory-controlling portion 130i may comprise a block (or circuit) 140, a block (or circuit) 142 and a block (or circuit) 144. The block 140 may be implemented, in one example, as a memory test socket and control block. The block 142 may be implemented, in one example, as an address control block. The block 144 may be implemented, in one example, as a response analyzer. The block 140 may have (i) a first input that may receive the signals TESTING STATUS FLAGS, (ii) a second input that may receive the signal COMMANDS/DATA, (iii) a third input that may receive one or more address validity signals (e.g., VALID_a, VALID_p), (iv) a first output that may present signals other than addresses to the memory 106i, (v) a second output that may present a comparison mode signal (e.g., CMP) and an expected output signal (e.g., DO_EXP) and (vi) a number of third outputs that may present a number of signals (e.g., ACTIVE_A, ACTIVE_B, . . . , ACTIVE_N, where N represents the number of ports of the memory 106i). The signals ACTIVE_A, ACTIVE_B, . . . , ACTIVE_N may be implemented as address control signals. An example of a memory test socket and control block that may be used to implement the block 140 may be found in a co-pending U.S. patent application Ser. No. 12/167,305, filed Jul. 3, 2008, and which is herein incorporated by reference in its entirety.

The block 142 may have (i) a first input that may receive the signal COMMANDS/DATA, (ii) a number of second inputs that may receive the signals ACTIVE_A, ACTIVE_B, . . . , ACTIVE_N, (iii) a first output that may present the one or more address validity signals VALID_a and VALID_p to the third input of the block 140, (iv) a second output that may present a synchronized version of the address validity signals and (v) a number of third outputs that may present a number of signals (e.g., ADR_A, ADR_B, . . . , ADR_N, where N represents the number of ports of the memory 106i). The signals ADR_A, ADR_B, . . . , ADR_N may be implemented as address signals corresponding with respective ports of the memory 106i.

The block 144 may have (i) a first input that may receive the comparison mode signal CMP and the expected output signal DO_EXP from the block 142, (ii) a second input that may receive output signals from the memory 106i, (iii) a third input that may receive the synchronized version of the address validity signal from the block 142 and (iv) an output that may present a signal (e.g., CURR_ERR). An example of a response analyzer that may be used to implement the block 144 may be found in a co-pending U.S. patent application Ser. No. 12/167,305, filed Jul. 3, 2008, and which is herein incorporated by reference in its entirety.

In one example, the block 142 may comprise a block (or circuit) 150, a block (or circuit) 152, a block (or circuit) 154, a block (or circuit) 156, a block (or circuit) 158, and a number of blocks (or circuit) 160a-160n. The block 150 may be implemented, in one example, as an address command decoder. The block 152 may be implemented, in one example, as one or more registers. The block 154 may be implemented, in one example, as an index shuttle. The block 156 may be implemented, in one example, as a register. The block 158 may be implemented, in one example, as a register. The blocks 160a-160n may be implemented, in one example, as multiplexer circuits.

The block 150 may have (i) an input that may receive the signal COMMANDS/DATA, (ii) a first output that may present one or more signals (e.g., EDIT_A, EDIT_B, . . . , EDIT_N), (iii) a second output that may present one or more signals (e.g., NEW_TRAJECTORY, NEW_DIM, NEW_DIR, etc.), and (iv) a third output that may present a signal (e.g., INDEX_CMD). The signals NEW_TRAJECTORY, NEW_DIM, and NEW_DIR may be implemented as trajectory control signals. The signals EDIT_A, EDIT_B, . . . , EDIT_N may be implemented as address editing control signals. The signal INDEX_CMD may be implemented as a differential index control signal.

The block 152 may have (i) an input that may receive the signals NEW_TRAJECTORY, NEW_DIM, and NEW_DIR and (ii) an output that may present a signal (e.g., TRAJECTORY_TYPE). The block 154 may have an input that may receive the signal INDEX_CMD and an output that may present a signal (e.g., BASE_INDEX). The block 156 may have (i) a first input that may receive the signals EDIT_A, EDIT_B, ..., EDIT_N, (ii) a second input that may receive the signal TRAJECTORY_TYPE, (iii) a third input that may receive the signal BASE_INDEX, (iv) a first output that may present the address validity signals, (v) a second output that may present a signal (e.g., ADR_a), (vi) a third output that may present a signal (e.g., ADR_p). The block 158 may have an input that may receive the address validity signal and an output that may present the synchronized version of the address validity signal. Each of the blocks 160a-160n may have a first data input that may receive the signal ADR_a, a second data input that may receive the signal ADR_p, a control input that may receive a respective one of the signals ACTIVE_A, ACTIVE_B, ..., ACTIVE_N, and an output that may present a respective one of the signals ADR_A, ADR_B, ..., ADR_N. The signal ADR_a may comprise active addresses. The signal ADR_p may comprise passive addresses.

The block 154 may be implemented, in one example, as a finite-state machine (FSM). The block 154 may be configured to determine the current location in terms of a number of steps from the beginning of the trajectory. Determining the current location in terms of a number of steps from the beginning of the trajectory allows the block 154 to be viewed (and implemented in hardware) in terms of a simple arithmetical model. For example, the block 154 may be considered as an n-bit register (or a set of n flip-flops), where n is large enough to cover the address space of the memory 106i connected to the collar 108i. In one example, a reasonable choice for n is such that $0.75 \times 2^n$>maximum address in the memory connected to the collar. A value (e.g., the signal BASE_INDEX) may be stored in the block 154.

In one example, the signal INDEX_CMD may be implemented as a 2-bit signal, where a first bit may be used as a first control signal (e.g., PLUS) and a second bit may be used as a second control signal (e.g., MINUS). A new value of the signal BASE_INDEX (e.g., $BASE\_INDEX_{new}$) may be generated by changing (controlling) a current (or old) value (e.g., $BASE\_INDEX_{old}$) based upon the signal INDEX_CMD. In one example, the signal $BASE\_INDEX_{new}$ may be generated as follows:

1. when PLUS=MINUS=0, $BASE\_INDEX_{new}$=$BASE\_INDEX_{old}$ (e.g., "no operation");
2. when PLUS=MINUS=1, $BASE\_INDEX_{new}$=0 (e.g., "reset");
3. when PLUS is not equal to MINUS and two highest (most significant) bits of $BASE\_INDEX_{old}$ are both equal to 1 (e.g., $BASE\_INDEX_{old} \geq 0.75 \times 2^n$), $BASE\_INDEX_{new}$=$BASE\_INDEX_{old}$; otherwise (e.g., if $BASE\_INDEX_{old} < 0.75 \times 2^n$) $BASE\_INDEX_{new}$=max(0, $BASE\_INDEX_{old}$+PLUS−MINUS).

The block 154 may comprise, in one example, a block 162 and a block 164. The block 162 may be implemented, in one example, as an index shuttle logic. The block 164 may be implemented, in one example, as a register (or a set of flip-flops with a common clock). The block 162 may have a first input that may receive the signal INDEX_CMD, a second input that may receive the signal $BASE\_INDEX_{old}$ and an output that may present the signal $BASE\_INDEX_{new}$ to an input of the block 164. The block 164 may have an output that may present the signal $BASE\_INDEX_{old}$. The block 162 may be configured to generate the signal $BASE\_INDEX_{new}$ in response to the signal $BASE\_INDEX_{old}$ and the signal INDEX_CMD. The block 164 may be configured to latch the signal $BASE\_INDEX_{new}$ for presentation as the signal $BASE\_INDEX_{old}$.

The block 142 generally implements a method and/or apparatus for organizing parallel address manipulations in the memory collar 108i. In one example, the block 142 may be configured to perform march tests, trajectories and decoding of differential encoded address sequences. In general, random access to the memory 106i uses a wide information flow, even if limited to considering address ports only. For each new memory access operation, new addresses are generally transmitted by the controller 104. Popular test strategies such as march schemes are very structured in terms of address sequences. For example, the addresses may be accessed along one of a few possible trajectories. An example of a list of commands that may be used to control addresses may be summarized as follows:

1. set fast row trajectory;
2. set fast column trajectory;
3. goto the 1st location on the trajectory;
4. goto the last location on the trajectory;
5. make one step forward along the trajectory;
6. make one step backward along the trajectory;
7. etc.

The above list is short enough for address controlling commands to be sent through a few wires. In one example, "bit sharing" between address-controlling and read/write-controlling signals also may be implemented. For example, combined commands may be used (e.g., "ADDR_A=current location; ADDR_B=next location; OP_A=write; OP_B=read; then move current location one step forward"). Each combined command may contain, for example, multiple address-related actions (e.g., what is the value of each address port relative to the current location? and how to change the current location before the next command runs?).

The present invention generally uses changes of current location and relations between the current location and actual addresses rather than transmitting addresses "as is". The present invention generally provides an approach that may be referred to as "differential encoding" of addresses. In one example, differential encoding at each clock cycle provides the following type of information: trajectory-setting signals (e.g., NEW_TRAJECTORY, NEW_DIM, NEW_DIR), a location-controlling signal (e.g., INDEX_CMD) and one or more edit-controlling signals for each port (e.g., EDIT_A, EDIT_B, ..., EDIT_N, where N represents the number of ports of the memory 106i connected to the collar 108i).

The trajectory-setting signals may be implemented, in one example, as 1-bit signals. In one example, the signal NEW_DIM may be configured to indicate whether to use a fast row or fast column trajectory. The signal NEW_DIR may be configured, in one example, to indicate whether to use a forward or backward walk. In one example, the signals NEW_DIM and NEW_DIR may be ignored when the signal NEW_TRAJECTORY is not asserted (e.g., a logic low or 0).

The location-controlling signal INDEX_CMD may be implemented, in one example, as a 2-bit signal. In one example, the signal INDEX_CMD may be configured to indicate how the current location is to be changed. For example, when the signal INDEX_CMD is implemented as a 2-bit signal, the signal INDEX_CMD may have 4 possible values, each of which may represent one of 4 possible actions: (i) don't change the current location; (ii) reset the current location to the starting point of the trajectory (depending on DIM and DIR); (iii) increment the current location one step forward; (iv) decrement the current location one step backward.

In one example, the port signals EDIT_A, EDIT_B, ..., EDIT_N may be implemented as 1-bit signals. A first state of the port signal (e.g., EDIT_A=0) may indicate, in one example, that a corresponding address signal (e.g., ADDR_A) points to the current location. A second state of the port signal (e.g., EDIT_A=1) may indicate, in one example, that the corresponding address signal ADR_A points to some "dual" location (described below in connection with FIGS. 15 and 16). The signal pairs EDIT_B and ADDR_B, ..., EDIT_N and ADDR_N may be implemented similarly.

For multi-port memories with more than two ports, the number of signals EDIT_A, EDIT_B, ..., EDIT_N may be reduced to only two using the following technique. At each clock cycle, set one of the ports as active, and all other ports as passive. Test schemes where all passive ports point to the same address may be implemented with the signal EDIT_A used as a correction signal for the active port, and the signal EDIT_B used as a correction signal for all passive ports. The active/passive status of ports is supposed to be changed non-frequently and by special commands; corresponding logic and status registers may be implemented as part of the memory test socket and control block 140. However, the block 150 may perform the decoding.

The three groups of outputs from the block 150 are generally processed separately. The signals NEW_TRAJECTORY, NEW_DIM and NEW_DIR may control two flip-flops holding status variables (e.g., DIM and DIR). When the signal NEW_TRAJECTORY=1, the status variables DIM and DIR may be set into the flip-flops for presentation as the signals NEW_DIM and NEW_DIR, respectively; otherwise the signals NEW_DIM and NEW_DIR may preserve the previous values. The signal INDEX_CMD may control the index shuttle block 154. The signals EDIT_A and EDIT_B may be used for controlling the address shuffling logic 156.

Figure 4:
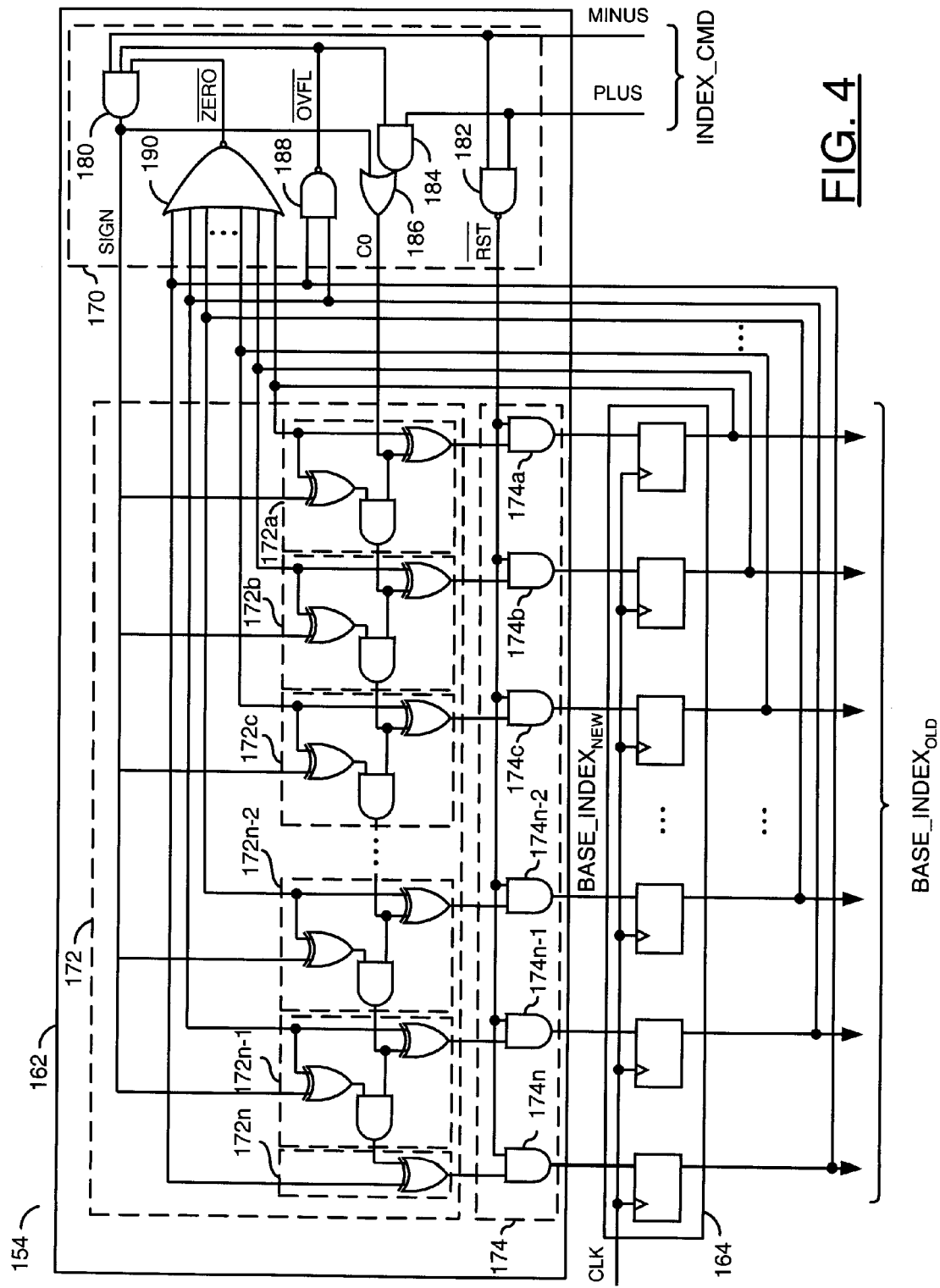
FIG. 4 is a diagram illustrating an example index shuttle logic in accordance with the present invention.

Referring to FIG. 4, a diagram is shown illustrating an example of the index shuttle logic 162 of FIG. 3 implemented in accordance with a preferred embodiment of the present invention. The index shuttle logic 162 may comprise multiple subunits. In one example, the index shuttle logic 162 may comprise a block (or circuit) 170, a block (or circuit) 172 and a block (or circuit) 174. The block 170 may be implemented, in one example, as a correction expander. The block 172 may be implemented, in one example, as an incrementor/decrementor. The block 174 may be implemented, in one example, as a reset circuit.

The block 170 may have a first input that may receive the signal INDEX_CMD, a second input that may receive the signal $BASE\_INDEX_{old}$, a first output that may present a signal (e.g., SIGN), a second output that may present a signal (e.g., C0) and a third output that may present a signal (e.g., $\overline{RST}$). The signals SIGN, C0 and $\overline{RST}$ may be implemented as register correction signals. The block 172 may have a first input that may receive the signal SIGN, a second input that may receive the signal $BASE\_INDEX_{old}$, a third input that may receive the signal C0 and an output that may present an intermediate version of the signal $BASE\_INDEX_{new}$. The block 174 may have a first input that may receive the intermediate version of the signal $BASE\_INDEX_{new}$ from the block 172, a second input that may receive the signal $\overline{RST}$ and an output that may present the signal $BASE\_INDEX_{new}$ to the block 164. The block 164 latches the signal $BASE\_INDEX_{new}$ to update the signal $BASE\_INDEX_{old}$.

In one example, the signals SIGN, C0 and $\overline{RST}$ may be referred to as expanded control signals, because the three signals SIGN, C0 and $\overline{RST}$ may be generated from the two single-bit signals PLUS and MINUS of the signal INDEX_CMD. The signals SIGN, C0 and $\overline{RST}$ may be configured to control how the signal $BASE\_INDEX_{old}$ from the block 164 is operated upon by the blocks 172 and 174 to generate the signal $BASE\_INDEX_{new}$. For example, when the signal $\overline{RST}$ is a logic low or 0, a reset is forced (e.g., each bit of the signal $BASE\_INDEX_{new}$ is set to a logic low or 0). The signal C0 generally indicates whether the value from the register 164 is to be altered (e.g., incremented or decremented), and the signal SIGN generally indicates the type of alteration (e.g., 0 for incrementing, 1 for decrementing).

The block 170 may comprise a block (or circuit) 180, a block (or circuit) 182, a block (or circuit) 184, a block (or circuit) 186, a block (or circuit) 188 and a block (or circuit) 190. The block 180 may be implemented, in one example, as an AND gate. The block 182 may be implemented, in one example, as a NAND gate. The block 184 may be implemented, in one example, as an AND gate. The block 186 may be implemented, in one example, as an OR gate. The block 188 may be implemented, in one example, as a NAND gate. The block 190 may be implemented, in one example, as a NOR gate.

The block 188 may be configured to generate an internal signal (e.g., $\overline{OVFL}$) in response to the signal $BASE\_INDEX_{old}$. The block 190 may be configured to generate an internal signal (e.g., $\overline{ZERO}$) in response to the signal $BASE\_INDEX_{old}$. The block 180 may be configured to generate the signal SIGN in response to the signals MINUS, $\overline{OVFL}$ and $\overline{ZERO}$. The block 182 may be configured to generate the signal $\overline{RST}$ in response to the component signals PLUS and MINUS of the signal INDEX_CMD. The block 184 may be configured to generate an output that may be presented to an input of the block 186 in response to the signals PLUS and $\overline{OVFL}$. The block 186 may be configured to generate the signal C0 in response to the signal SIGN and the output received from the block 184.

The signals $\overline{OVFL}$ and $\overline{ZERO}$ generally provide range correctness. For example, any attempt to leave a zone where $BASE\_INDEX_{old} \geq 0.75 \times 2^n$ (with the exception of resetting) is generally blocked. Also, an attempt to decrement below the value of 0 is also generally blocked. The latter limitation is optional and may be omitted (e.g., eliminating the gate 190), because control sequences going below the value of 0 may be avoided during the programming of input command sequences.

In one example, the block 172 may comprise a plurality of blocks (or circuits) 172a-172n. Each of the blocks (or circuits) 172a-172n may be configured to generate a 1-bit slice of the output of the incrementor/decrementor 172. The block 174 may comprise, in one example, a plurality of AND gates 174a-174n. The expanded control signals SIGN, C0 and $\overline{RST}$ interact with the signal $BASE\_INDEX_{old}$ (e.g., taken from the register 164) in the chain of slice units 172a-172n and the plurality of AND gates 174a-174n to generate the signal $BASE\_INDEX_{new}$ at the output of the block 162. In one example, the last slice unit in the chain of slice units (e.g., the block 172n) may be implemented with fewer components than the other slice units 172a-172n-1, because one of the outputs may be eliminated since there is no further slice unit to be connected to the chain.

Referring to FIGS. 5(A-C) diagrams are shown illustrating example implementations of a variety of slice units. In a first example, a slice unit 200 (FIG. 5A) may have a first input that may receive a signal (e.g., CIN), a second input that may receive a signal (e.g., IN), a third input that may receive a signal (e.g., SIGN), a first output that may present a signal (e.g., OUT) and a second output that may present a signal (e.g., COUT). The signals CIN and COUT may be implemented as carry-in and carry-out signals, respectively. The signals IN and OUT may be implemented as primary input and primary output signals, respectively. The signal SIGN may be configured to define the operation performed by the slice unit. For example, addition or subtraction may be indicated by SIGN=0 or 1, respectively. A slice unit 202 (FIG. 5B) or a slice unit 204 (FIG. 5C) may be implemented when two carry inputs are desired. Each of the slice units 172a-172n may be implemented using one of the slice units 200, 202 and 204.

Figure 6:
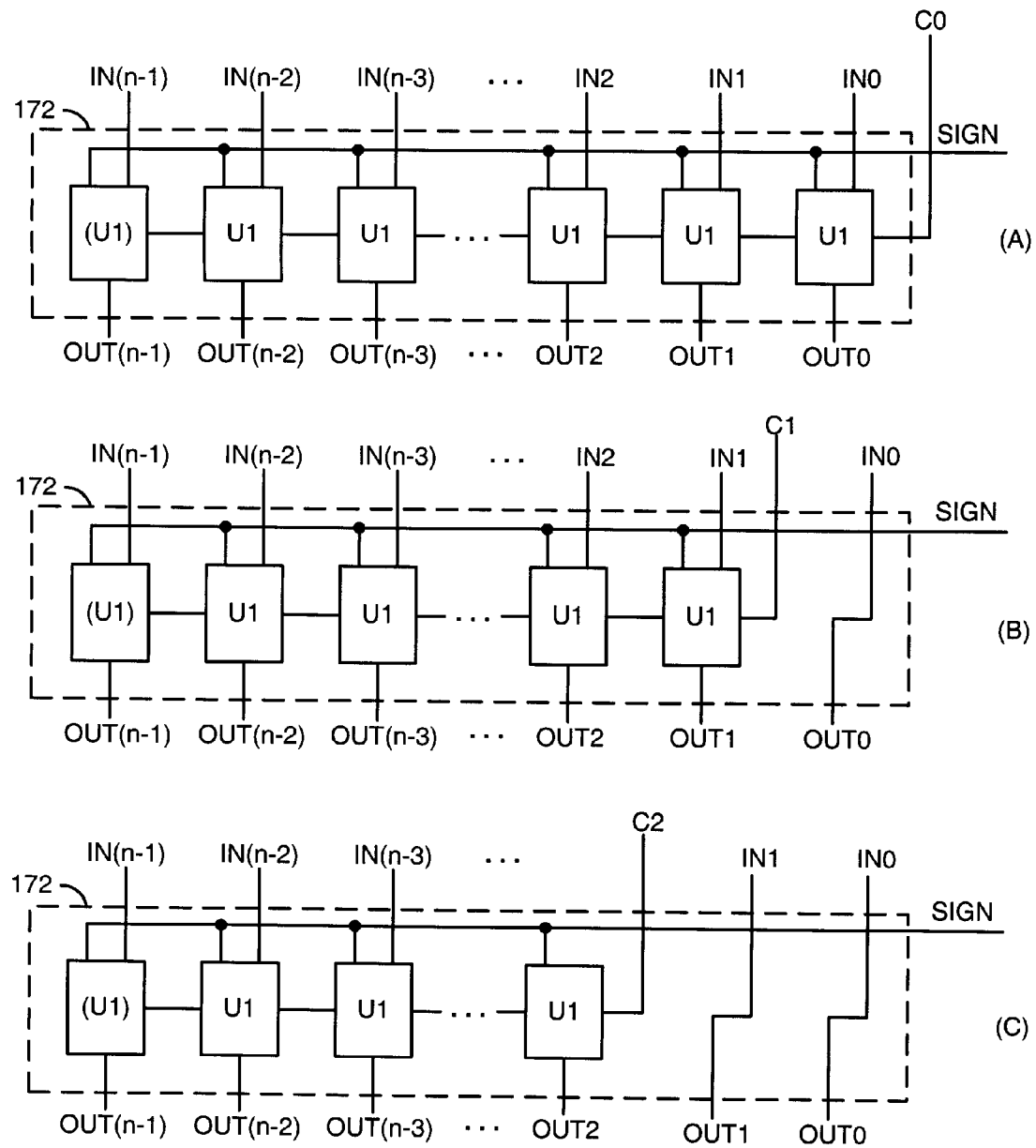
FIG. 6(A-C) are diagrams illustrating arithmetic circuits in accordance with the present invention.

Referring to FIGS. 6(A-C), diagrams are shown illustrating the block 172 of FIG. 4 configured to provide various modifications to the signal BASE_INDEX$_{old}$. In one example, the block 172 of FIG. 4 may be configured as shown in FIG. 6A to provide a modification of x:=x±1 (e.g., x:=x± (00 . . . 0000C$_0$). In another example, the block 172 of FIG. 4 may be configured as shown in FIG. 6B to provide a modification of x:=x±2 (e.g., x:=x±(00 . . . 000C$_1$0). In still another example, the block 172 of FIG. 4 may be configured as shown in FIG. 6C to provide a modification of x:=x±4 (e.g., x:=x± (00 . . . 00C$_2$00). Other modifications may be implemented accordingly to meet the design criteria of a particular implementation. In general, the least significant bits of the register 164 may be treated as constants (e.g., the bits become 0 after the first occurrence of the reset commands and generally do not switch back to 1). By treating the least significant bits as constants, extra gates and flip-flops may be eliminated. However, the gates and flip-flops may be preserved for possible usage in other circumstances. The label U1 is used to indicate a whole slice unit (e.g., as shown in FIGS. 5(A-C)). The label (U1) is used to indicate a reduced slice unit (e.g., with one of the outputs eliminated.

Figure 7:
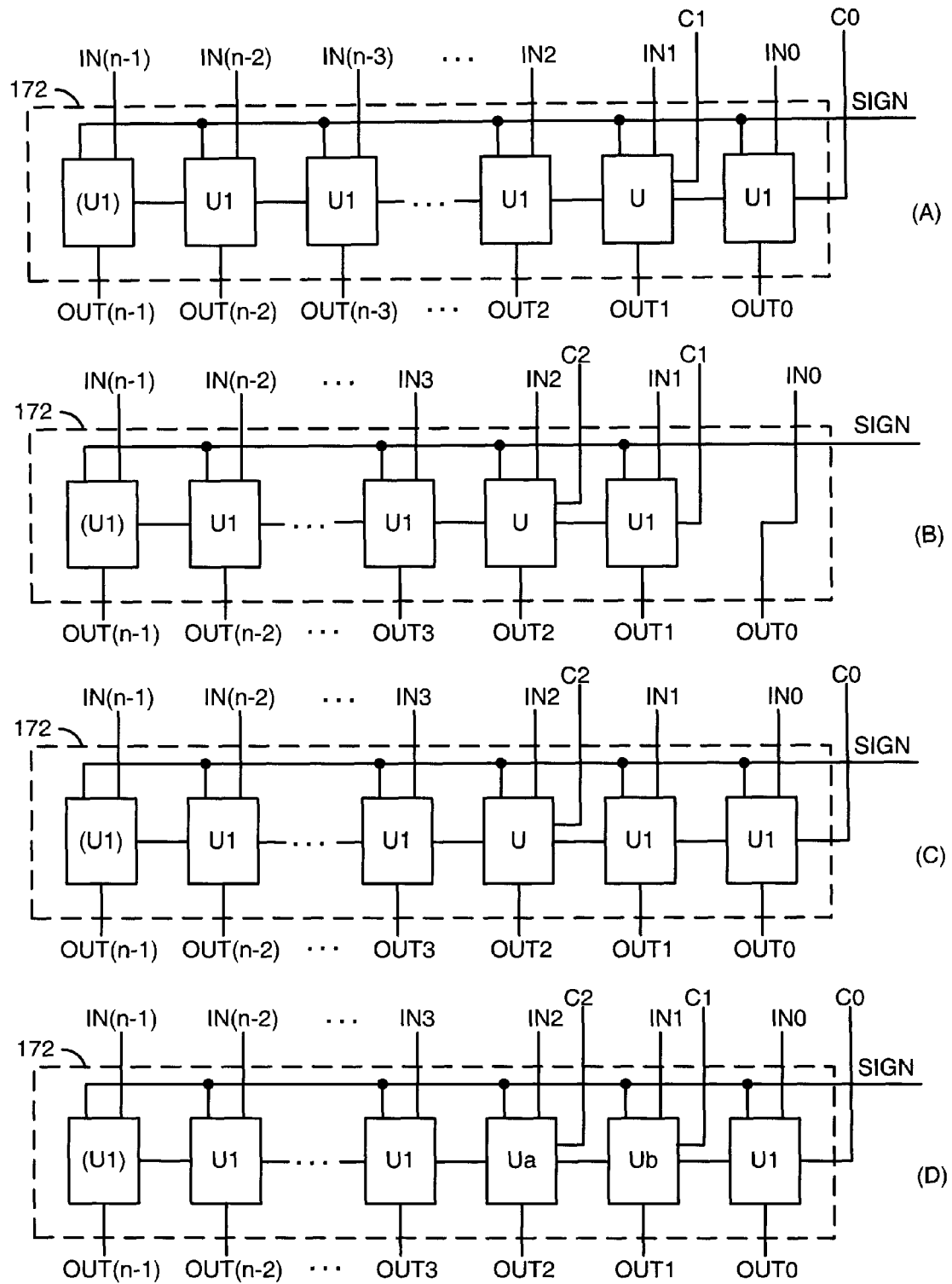
FIGS. 7(A-D) are diagrams illustrating further arithmetic circuits.

Referring to FIGS. 7(A-D), diagrams are shown illustrating example implementations of the block 172 in accordance with alternative embodiments of the present invention. In one example, a slightly more radical modification may allow more complicated operations than just x:=x±y for y∈{0,±2$^n$} to be implemented. In one example, input encoding may be implemented using a system of command vectors INDEX_CMD, in order to implement any x:=x±y for y∈{0; ±y$_1$, ±y$_2$, . . . , ±y$_k$}, where y$_i$ are given positive integer constants. The system may have 2k+2 commands: 2k+1 possible values of y plus one more command for reset. The block 170 may be configured to convert the command vectors INDEX_CMD into up to n+2 signals (e.g., the signal SIGN, the signal $\overline{RST}$ and n bits c$_0$, c$_1$, . . . , c$_{n-1}$ (some or even most of which may be constantly equal to 0). The block 170 may be further configured to take into consideration "boundary conditions" like ZERO and OVFL.

The chain of slice units 172a-172n may be arranged to provide the desired modifications. If initial bits c$_0$, c$_1$, etc. are constantly 0, shortcuts may be made between respective inputs and outputs (e.g., as illustrated above in FIGS. 6(B and C). The remaining bit-slices 172i may be implemented using one or more of the blocks 200, 202 and 204 illustrated in FIGS. 6(A-C). In general, each of the blocks 172a-172n may be implemented with a slice unit comprising one or two extra (in addition to the inputs for the signals SIGN and BASE_INDEX$_i$) inputs (e.g., one from the previous block, when the current block is not the first one in the chain, and one from c$_i$, if the respective c$_i$ is not constantly equal to 0). In the case of only one extra input, the block 200 may be used (e.g., indicated by the label U1). For two extra inputs, either the block 202 or the block 204 may be chosen (indicated by the labels U, Ua and Ub). In one example, the block 202 may be used for the ith bit-slice if c$_i$=1 may occur only when c$_{i-1}$=c$_{i-2}$= . . . =c$_2$=c$_1$=c$_0$=0, otherwise the block 204 may be used.

A few examples may be illustrated with reference to FIGS. 7(A-D). When the block 172 is implemented as shown in FIG. 7A, implementing the block U with the block 202 provides y∈{0,±1,±2}, while implementing the block U with the block 204 provides y∈{0,±1,±2,±3}. When the block 172 is implemented as shown in FIG. 7B, implementing the block U with the block 202 provides y∈{0,±2,±4}, while implementing the block U with the block 204 provides y∈{0,±2,±4,±6}. When the block 172 is implemented as shown in FIG. 7C, implementing the block U with the block 202 provides y∈{0,±1, ±4}, while implementing the block U with the block 204 provides y∈{0,±1,±4,±5}. When the block 172 is implemented as shown in FIG. 7D, implementing the blocks Ua and Ub with the block 202 provides y∈{0,±1,±2,±4}, implementing the blocks Ua and Ub with the blocks 202 and 204, respectively, provides y∈{0,±1,±2,±3,±4}, implementing the blocks Ua and Ub with the blocks 204 and 202, respectively, provides y∈{0,±1,±2,±4,±5,±6}, and implementing the blocks Ua and Ub with the block 204 provides y∈{0,±1, . . . ±7}.

Referring to FIG. 8, a diagram is shown illustrating examples of a full-adder (FA) 210 and a half-adder (HA) 212. Another possible method of modifying the signal BASE_INDEX$_{old}$ to obtain the signal BASE_INDEX$_{new}$ may be based on an encoding scheme of "y" in "x:=x+y". In one example, a so-called 2's complement (TC) notation may be used instead of the sign-and-magnitude (SAM) notation described above. A correspondence between the SAM notation and the TC notation may be illustrated using a 4-bit encoding example as summarized in the following TABLE 1:

TABLE 1

| Integer | SAM | TC |
| --- | --- | --- |
| +7 | 0, 111 | 0111 |
| +6 | 0, 110 | 0110 |
| +5 | 0, 101 | 0101 |
| +4 | 0, 100 | 0100 |
| +3 | 0, 011 | 0011 |
| +2 | 0, 010 | 0010 |
| +1 | 0, 001 | 0001 |
| +0 | 0, 000 | 0000 |
| −0 | 1, 000 | — |
| −1 | 1, 001 | 1111 |
| −2 | 1, 010 | 1110 |
| −3 | 1, 011 | 1101 |
| −4 | 1, 100 | 1100 |
| −5 | 1, 101 | 1011 |
| −6 | 1, 110 | 1010 |
| −7 | 1, 111 | 1001 |
| −8 | — | 1000 |

Referring to FIGS. 9(A-B), diagrams are shown illustrating implementation of the block 172 using a plurality of full-adders 210 and a half-adder 212. Arithmetic operations (e.g., addition and subtraction) in the TC notation are identical to operations for non-negative integers. In one example, the blocks 172b-172n may be implemented using the full-adders (FA) 210 and the block 172a may be implemented using one half-adder (HA) 212 as illustrated in FIGS. 9(A-B). The term "y" in "x:=x+y" may have a lot of constantly zero bits in the SAM notation, however, the same may not be true in the TC notation. For example, even the simplest case y∈{0,+1,−1} generally corresponds to full n-bit numbers (e.g., 000 . . . 000, 000 . . . 001, and 111 . . . 111). The full-adder blocks 210 may be used for almost all of the bit-slices (e.g., see FIG. 9(A)). However, the block 172 implemented with full-adders 210 and a half-adder 212 may be optimized for the number of different bits of y. For example, in the case of y∈{0,+1,−1}, the n−1 higher bits of y=$d_{n-1}d_{n-2} \ldots d_2d_1d_0$ (in TC notation) may be identical. In one example, the block 170 may produce a 2-bit representation of y, and the representation may be expanded to n bits on-the-fly (e.g., see FIG. 9(B)).

Figure 10:
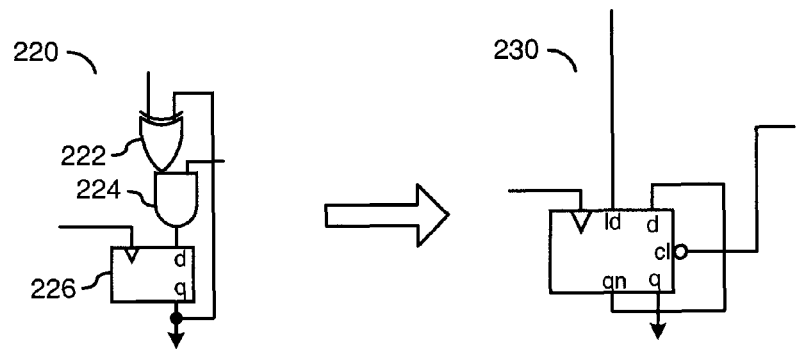
FIG. 10 is a diagram illustrating a complex flip-flop with gated input, synchronous clear and two mutually inverted outputs.

Referring to FIG. 10, a diagram is shown illustrating two behaviorally equivalent storage elements that may be used to implement the index shuttle 154 in accordance with another embodiment of the present invention. In general, the various embodiments of the index shuttle 154 may be effectively implemented in technology libraries with flip-flops other that just a basic one. Enhanced types of flip-flops may include extra inputs and/or outputs. For example, an enhanced (or complex) flip-flop may include a input cl (or clear input), an input ld (or load data input) and an output qn. The input cl may be configured as a synchronous reset (e.g., cl=0 during a rising edge of the clock forces a transition into state 0). The input ld may be configured to control data changes (e.g., standard data-driven transitions are enabled only when ld=1, otherwise the state of the flip-flop remains unchanged). The output qn may be configured to present a digital complement of an output q.

Figure 11:
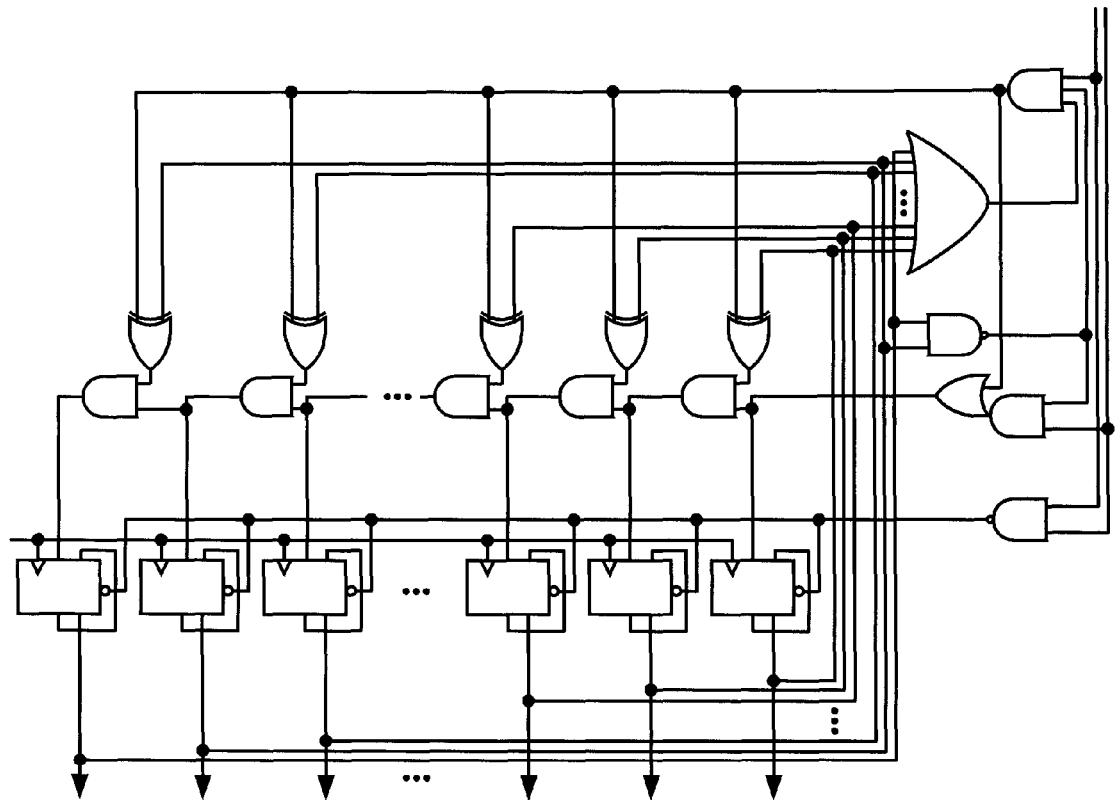
FIG. 11 is a diagram illustrating an index shuttle logic implemented with complex flip-flops.

In one example, a storage element 220 may be implemented with an Exclusive-OR gate 222, an AND gate 224 and a D-type flip-flop 226. A complex flip-flop 230 may be implemented that behaves equivalently to the storage element 220 while reducing an amount of random logic (e.g., eliminating the gates 222 and 224). Since the various embodiments of the index shuttle 154 described above generally contain connections similar to the connections between the gate 222, the gate 224 and the flip-flop 226, the index shuttle 154 may be implemented using a number of the complex flip-flops 230, as illustrated in FIG. 11.

The example embodiments of the index shuttle 154 presented herein have been optimized primarily for size, however, embodiments of the index shuttle 154 may also be implemented (or optimized) to improve timing. In one example, the parts of the index shuttle 154 that are most critical with respect to timing may be the horizontal chains of AND gates. Replacing the chains of AND gates with combinations of balanced trees may reduce the delay from O(n) to O(log n). In more complicated cases, the chain may also include gates of other than just AND types (e.g., when the chain goes through slice units 202, 204 or 210). However, delay-reducing transformations may still be implemented (e.g., similar to well-known transformation of ripple-carry adders to carry-look-ahead adders) that also enable reducing delay to O(log n).

The address shuffling logic 156 will now be described. In one example, a predefined finite set of trajectories may be designated as T and a predefined finite set of editing commands may be designated as E. In the simplest case, E={0(do not edit), 1(edit)}. Address shuffling may be defined as mapping AS: (t,i,e)→(a,v), where trajectory t∈T, index i is a non-negative integer, editing command e∈E, actual address a∈{0, 1, . . . , max. address}, and validity v∈{0(invalid), 1 (valid)}. Applying the address shuffling definition presented above, the address shuffing logic 156 receives i from the index shuttle 154, t (actually, a bit-vector defining t) from the trajectory registers 152, and a pair of editing commands $e_a$ and $e_p$ (e.g., separate commands for the active port and the passive port(s), respectively) directly from the address command decoder 150. The address shuffing logic 156 generally computes actual addresses (e.g., $a_a$ and $a_p$, for the active port and the passive ports, respectively), as well as validity flags (e.g., $v_a$ and $v_p$) for the respective addresses. In a particular implementation, $v_a$ may equal $v_p$ constantly. IN such a case, a single validity flag V may be used. Both ports may be described by the same mapping AS. For example, $(a_a, v_a)$=AS(t, i, $e_a$) and $(a_p, v_p)$=AS(t, i, $e_p$).

Figure 12:
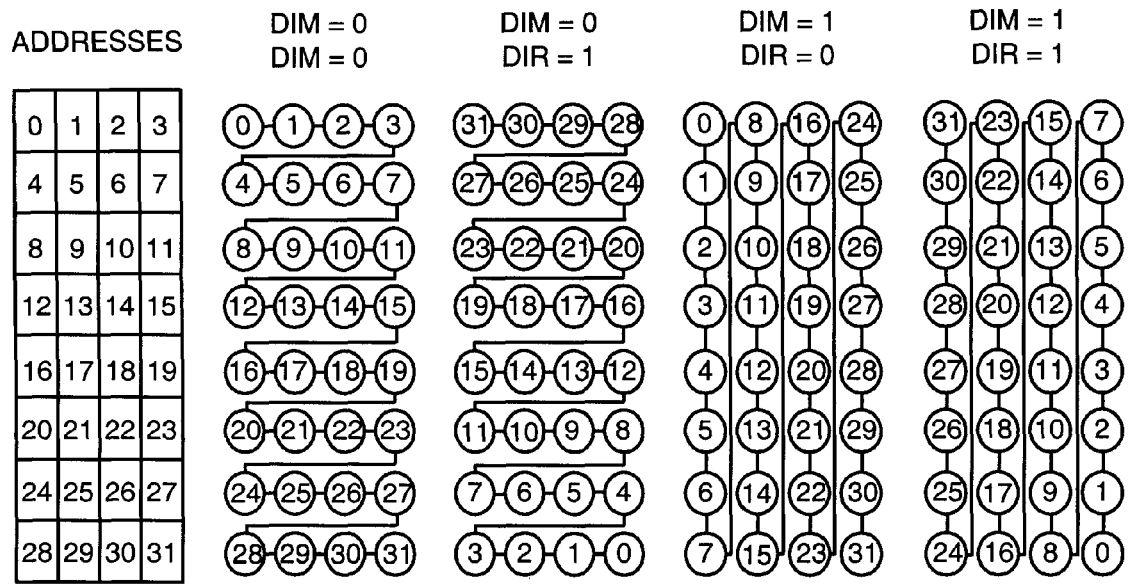
FIG. 12 is a diagram illustrating standard trajectories for 8 row and 4 columns.

Referring to FIG. 12, a diagram is shown illustrating trajectories that may be used by a standard address shuffling scheme for an 8-row, 4-column memory. A corresponding mapping may be expressed by the following formulae, where size represents the size of the memory under test (e.g., the maximum address of the memory plus 1), c represents the number of columns and the variable e is omitted for the simplicity:

$$DIM=0, DIR=0: a_p=i;$$

$$DIM=0, DIR=1: a_p=\text{size}-1i;$$

$$DIM=1, DIR=0: a_p=(i\%c)(\text{size}/c)+(i/c)$$

$$DIM=1, DIR=1: a_p=\text{size}-1-[(i\%c)(\text{size}/c)+(i/c)];$$

$v_p$ in all these cases is 1 iff $a_p$<size and 0 otherwise.

If size and c are powers of 2, the operations may be expressed in a very simple form. Suppose i has binary representation ($i_{s-1}$, $i_{s-2}$, . . . , $i_0$), where s=$\log_2$(size). Further suppose k=$\log_2$ c. The binary representation of $a_p$ for the above-mentioned four cases may be summarized as follows:

($i_{s-1}$, $i_{s-2}$, . . . , $i_0$);
($\bar{i}_{s-1}$, $\bar{i}_{s-2}$, . . . , $\bar{i}_0$);
($i_{k-1}$, $i_{k-2}$, . . . , $i_0$, $i_{s-1}$, $i_{s-2}$, . . . , $i_k$);
($\bar{i}_{k-1}$, $\bar{i}_{k-2}$, . . . , $\bar{i}_0$, $\bar{i}_{s-1}$, $\bar{i}_{s-2}$, . . . , $\bar{i}_k$).

The above standard mapping is simple, but may be improved to resolve the following two issues:

1. Suppose the memory 106i contains a checkerboard pattern, where vertically or horizontally neighboring locations store opposite values. For example, locations 0, 2, 5, 7, 8, 10, 13, 15, etc. contain X, and locations 1, 3, 4, 6, 9, 11, 12, 14, etc. contain Y=$\bar{X}$. Then reading along the trajectory will result in very different sequences:

DIM=0: XYXYYXYXXYXYYXYXXYXYYXYXX-YXYYXYX

DIM=1: XYXYXYXYYXYXYXYXXYXYXYXYYX-XYXYX

Predicting the above sequences takes knowledge of c, and therefore cannot be made in an universal way.

2. The standard trajectories contain non-local "jumps", like ones between addresses 3 and 4 (for DIM=0), or between addresses 7 and 8 (for DIM=1).

Figure 13:
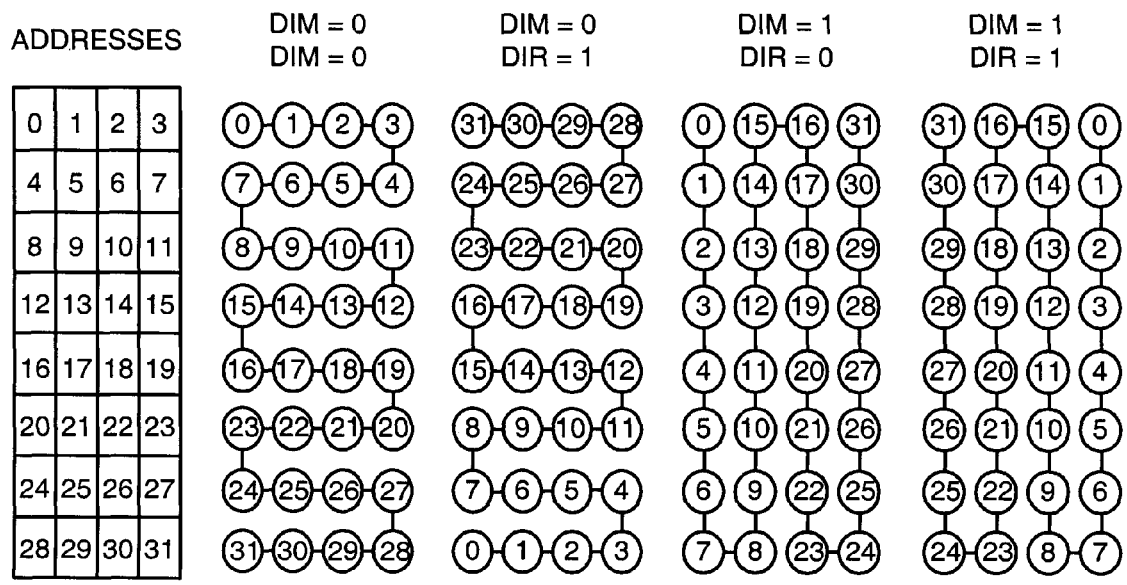
FIG. 13 is a diagram illustrating snake trajectories for 8 rows and 4 columns.

Referring to FIG. 13, a diagram is show illustrating so-called snake trajectories in accordance with embodiments of the present invention. The snake trajectories generally fix the two issues described above. In one example, the snake trajectories may be produced from the standard trajectories by mirroring each second row (column). In one example, the mapping may be as follows:

$$DIM=0, DIR=0: (i_{s-1}, i_{s-2}, \ldots, i_k, i_{k-1} \oplus i_k, i_{k-2} \oplus i_k, \ldots, i_0 \oplus i_k);$$

$$DIM=0, DIR=1: (\bar{i}_{s-1}, \bar{i}_{s-2}, \ldots, \bar{i}_k, i_{k-1} \oplus i_k, i_{k-2} \oplus i_k, \ldots, i_0 \oplus i_k);$$

$$DIM=1, DIR=0: (i_{s-k-1}, i_{s-k-2}, \ldots, i_0, i_{s-1} \oplus i_{s-k}, i_{s-2} \oplus i_{s-k}, \ldots, i_{s-k} \oplus i_{s-k});$$

$$DIM=1, DIR=1: (\bar{i}_{s-k-1}, \bar{i}_{s-k-2}, \ldots, \bar{i}_0, i_{s-1} \oplus i_{s-k}, i_{s-2} \oplus i_{s-k}, \ldots, i_{s-k} \oplus i_{s-k}).$$

The above four cases may be rewritten as the following sequence of computations:

$$q_{hi} = DIM \ \& \ i_{s-k} \lor \overline{DIM} \ \& \ DIR;$$

$$q_{lo} = DIM \ \& \ DIR \lor \overline{DIM} \ \& \ i_k;$$

$$j_{s-1} = DIM \ \& \ i_{s-k-1} \lor \overline{DIM} \ \& \ i_{s-1},$$

$$j_{s-2} = DIM \ \& \ i_{s-k-2} \lor \overline{DIM} \ \& \ i_{s-2},$$

...

$$j_k = DIM \ \& \ i_0 \lor \overline{DIM} \ \& \ i_k,$$

$$j_{k-1} = DIM \ \& i_{s-1} \lor \overline{DIM} \ \& \ i_{k-1},$$

$$j_{k-2} = DIM \ \& \ i_{s-2} \lor \overline{DIM} \ \& \ i_{k-2},$$

...

$$j_0 = DIM \ \& \ i_{s-k} \lor \overline{DIM} \ \& \ i_0,$$

$$z_{s-1} = j_{s-1} \oplus q_{hi}, z_{s-2} = j_{s-2} \oplus q_{hi}, \ldots, z_{s-k} = j_{s-k} \oplus q_{hi},$$

$$z_{s-k-1} = j_{s-k-1} \oplus q_{lo}, z_{s-k-2} = j_{s-k-2} \oplus q_{lo}, \ldots, z_0 = j_0 \oplus q_{lo};$$

where $(z_{s-1}, \ldots, z_0)$ is the binary representation of ap.

Figure 14:
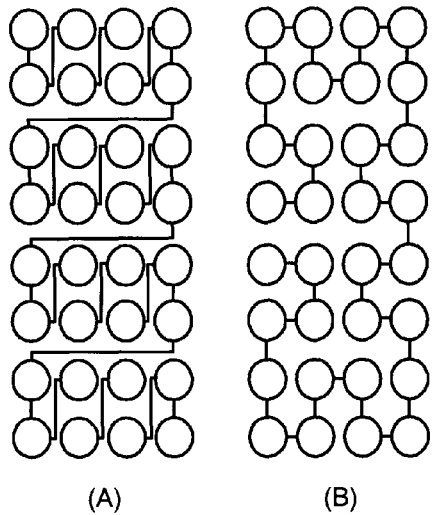
FIGS. 14(A-B) are diagrams illustrating alternative trajectories.

Referring to FIGS. 14(A-B), diagrams are shown illustrating more sophisticated trajectories that may be implemented in accordance with another embodiment of the present invention. The trajectories illustrated in FIGS. 14(A-B) may provide, in one example, a more thorough testing of possible erroneous interactions of neighboring memory cells. For example, trajectories may be implemented for deeper access to adjacent rows (FIG. 14(A)) or inspired by the Peano curve (FIG. 14(B)).

During march tests, actual addresses may perform a kind of dancing around a current point of the trajectory. In multiport memories, the dance of different ports is intentionally not identical; in one popular implementation, addresses on two ports may be controlled in such a way that the addresses point to the same column in neighboring rows every time. For example, if one of addresses points to the sth row, then another one points to the row t, where binary representation of numbers s and t differ only in the least significant bit. This scheme enables very simple hardware implementation. For example, a first of the addresses may be generated, and the second address may be obtained by simply inverting the least significant row address bit of the first address.

However, obtaining the second address by inverting the least significant row address bit of the first address does not allow for memory-independent generation of I/O sequences. In an example where the memory 106i initially was filled with 0, and a march phase like: "write 1 to the current location and simultaneously read from the dual location" is performed, if the memory under test has n columns, then the output sequence (when addresses are generated in the natural order) will be 0″1″0″1″ . . . . Prediction of the output for memories of different widths generally cannot be shared.

To avoid this problem, a restriction on addressing may be implemented such that the "dance" is performed only along the trajectory. In one example, when a current position on the trajectory is the sth one, addresses may point (independently for active and passive ports) to s or to t, where binary representations of integers s and t differ in the least significant bit only.

Figure 15:
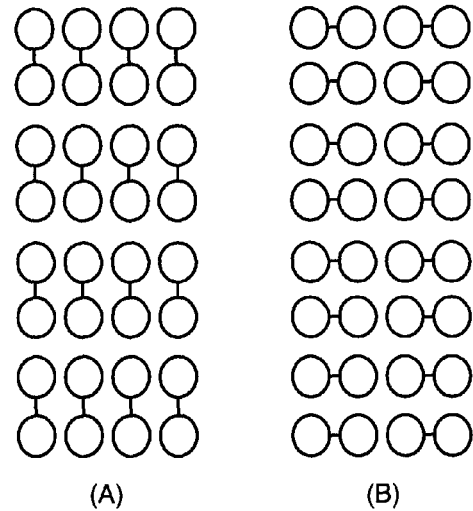
FIGS. 15(A-B) are diagrams illustrating mutually dual locations for snake trajectories.

Referring to FIGS. 15(A-B), diagrams are shown illustrating pairs of dual locations for (i) vertical snakes where DIM=1 (FIG. 15A) and (ii) for horizontal snakes where DIM=0 (FIG. 15B). Computationally, addition of the above address editing entails only one extra operation to the method described above in connection with FIGS. 14(A-B). In expressions for $j_0$ and $j_k$, the term $i_0$ is replaced with $(i_0 \oplus e)$, where e is an editing flag (e.g., an input variable).

The methods described above produce simple computations if the number c of columns and the number r=size/c of rows are both of the form $2^m$: only in such a case is computing expressions like (i % c)r+i/c almost free, because the process may be implemented as a data-independent reordering of bits. In general, the number of columns is preferably a power of 2 in all real implementations, but the number of rows may be arbitrary. For example, memories generally may have 16 or 32 rows. However 20, 24 or 28 rows are possible values as well.

To use the benefit of simple calculations in the general case, a memory may be treated as having a number of rows of the form $2^m$ and monitoring which addresses are valid and which are not. For example, the signals VALID_a and VALID_p may be maintained for active and passive ports, and used to (i) block any attempts to access the memory on an invalid address and/or (ii) suppress output correctness checking after the attempts.

Figure 16:
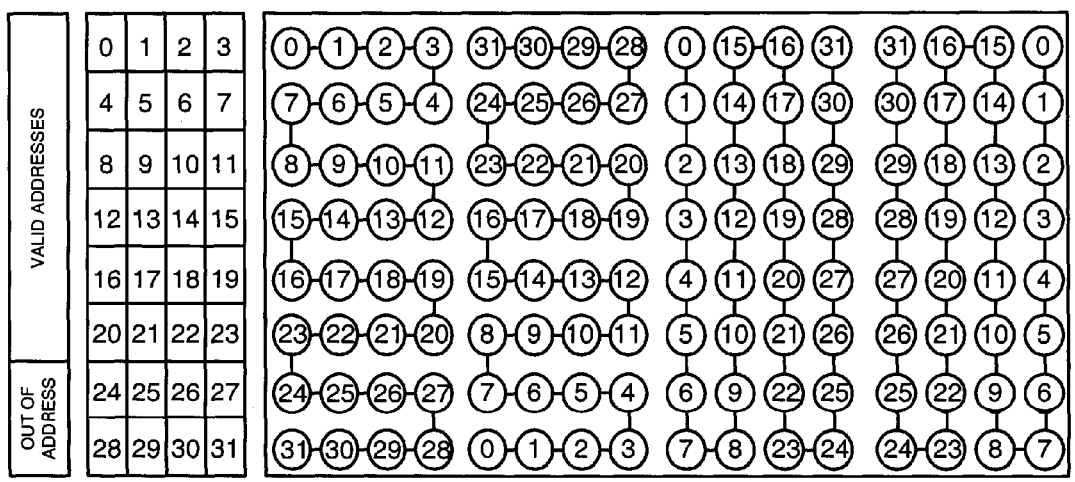
FIG. 16 is a diagram illustrating regions of valid and invalid addresses.

Referring to FIG. 16, a diagram is shown illustrating the above approach for a 24-word, 4-column memory. The approach may be imaginarily extended to 32 addresses, where addresses 24 . . . 31 are invalid. Marching along different trajectories, the zone of valid addresses may be left and re-entered many times. Testing of address validity is usually a very simple operation. For example, the comparison ADR<size may use only a few highest (most significant) bits of the address. In general, memories have $2^m$, $3 \times 2^m$, $5 \times 2^m$ or $7 \times 2^m$ words, so the comparison may be implemented with 1-2 binary gates.

Figure 17:
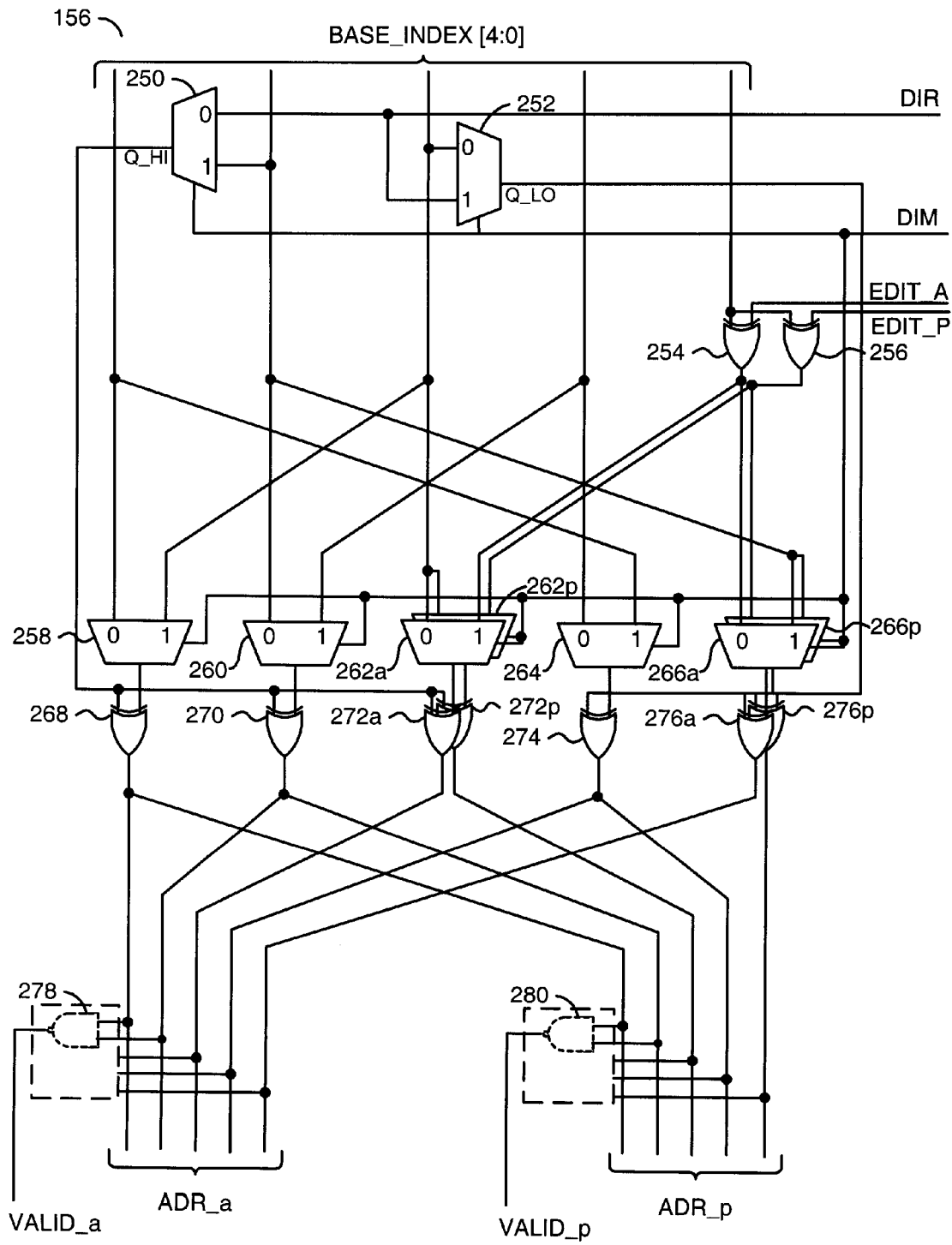
FIG. 17 is a diagram illustrating an address shuffling module of FIG. 3, implemented in accordance with a preferred embodiment of the present invention.

Referring to FIG. 17, a diagram is shown illustrating an example address shuffling logic 156 implemented in accordance with a preferred embodiment of the present invention. In one example, the address shuffling logic 156 may comprise a block (or circuit) 250, a block (or circuit) 252, a block (or circuit) 254, a block (or circuit) 256, a block (or circuit) 258, a block (or circuit) 260, a block (or circuit) 262a, a block (or circuit) 262p, a block (or circuit) 264, a block (or circuit) 266a, a block (or circuit) 266p, a block (or circuit) 268, a block (or circuit) 270, a block (or circuit) 272a, a block (or circuit) 272p, a block (or circuit) 274, a block (or circuit) 276a, a block (or circuit) 276p, a block (or circuit) 278 and a block (or circuit) 280. The blocks 250, 252, 258, 260, 262a, 262p, 264, 266a and 266p may be implemented as multiplexer circuits. The blocks 254, 256, 268, 270, 272a, 272p, 274, 276a and 276p may be implemented as Exclusive_OR (XOR) gates. The blocks 278 and 280 may be implemented as NAND gates.

The signal DIM may be presented to a control input of each of the multiplexer circuits 250, 252, 258, 260, 262a, 262p, 264, 266a and 266p. The signal DIR may be presented to (i) an input of the multiplexer circuit 250 that is connected to the output when the signal DIM is a logic low or 0 and (ii) an input of the multiplexer circuit 252 that is connected to the output when the signal DIM is a logic high or 1. Bit 4 of the signal BASE_INDEX may be presented to (i) an input of the multiplexer circuit 258 that is connected to the output when the signal DIM is a logic low or 0 and (ii) an input of the multiplexer circuit 264 that is connected to the output when the signal DIM is a logic high or 1. Bit 3 of the signal BASE_INDEX may be presented to (i) an input of the multiplexer circuit 250 that is connected to the output when the signal DIM is a logic high or 1, (ii) an input of the multiplexer circuit 260 that is connected to the output when the signal DIM is a logic low or 0, and (iii) an input of the multiplexer circuits 266a and 266p that are connected to the respective outputs when the signal DIM is a logic high or 1. Bit 2 of the signal BASE_INDEX may be presented to (i) an input of the multiplexer circuit 252 that is connected to the output when the signal DIM is a logic low or 0, (ii) an input of the multiplexer circuit 258 that is connected to the output when the signal DIM is a logic high or 1, and (iii) an input of the multiplexer circuits 262a and 262p that are connected to the respective outputs when the signal DIM is a logic low or 0. Bit 1 of the signal BASE_INDEX may be presented to (i) an input of the multiplexer circuit 260 that is connected to the output when the signal DIM is a logic high or 1 and (ii) an input of the multiplexer circuit 264 that is connected to the output when the signal DIM is a logic low or 0. Bit 0 of the signal BASE_INDEX may be presented to a first input of the gate 254 and a first input of the gate 256.

The signal EDIT_A may be presented to a second input of the gate 254. The signal EDIT_P may be presented to a second input of the gate 256. An output of the gate 254 may be presented to (i) an input of the multiplexer circuit 262a that is connected to the output when the signal DIM is a logic high or 1 and (ii) an input of the multiplexer circuit 266a that is connected to the output when the signal DIM is a logic low or 0. An output of the gate 256 may be presented to (i) an input of the multiplexer circuit 262p that is connected to the output when the signal DIM is a logic high or 1 and (ii) an input of the multiplexer circuit 266p that is connected to the output when the signal DIM is a logic low or 0.

An output of the multiplexer circuit 250 may be presented to a first input of the gates 268, 270, 272a and 272p. An output of the multiplexer circuit 252 may be presented to a first input of the gates 274, 276a and 276p. An output of the multiplexer circuit 258 may be presented to a second input of the gate 268. An output of the multiplexer circuit 260 may be presented to a second input of the gate 270. An output of the multiplexer circuit 262a may be presented to a second input of the gate 272a. An output of the multiplexer circuit 262p may be presented to a second input of the gate 272p. An output of the multiplexer circuit 264 may be presented to a second input of the gate 274. An output of the multiplexer circuit 266a may be presented to a second input of the multiplexer circuit 266a may be presented to a second input of the gate 276a. An output of the multiplexer circuit 266p may be presented to a second input of the gate 276p.

An output of each of the gates 268, 270, 272a, 274 and 276a may be presented as bits of the signal ADR_a. An output of each of the gates 268, 270, 272p, 274 and 276p may be presented as bits of the signal ADR_p. The two most significant bits of the signal ADR_a may be presented to inputs of the gate 278. An output of the gate 278 may present the signal VALID_a. The two most significant bits of the signal ADR_p may be presented to inputs of the gate 280. An output of the gate 280 may present the signal VALID_p.

The example address shuffling logic 156 generally illustrates comparison of 5-bit addresses with a constant 24. The particular comparison illustrated may be implemented with a single NAND gate. Moreover, in the particular example illustrated, the resulting address validity signals VALID_a and VALID_p do not depend on the input signals EDIT_A and EDIT_P, allowing the same comparator to be used for both ports.

The multiplexer circuits 250 and 252 may be configured to generate the signals $q_{hi}$ and $q_{lo}$, respectively. The gates 254 and 256 may be configured to edit the least significant bit of the The least significant bit of the signal BASE_INDEX may be edited differently for active and passive ports. For example, some parts of the netlist of the address shuffling logic 156 may be different for the active and passive ports. Points where differences occur between the active and passive ports have labels including a or p, respectively. The multiplexer circuits 258, 260, 262a, 262p, 264, 266a and 266p generally produce the signals $j_{s-1}, \ldots, j_0$. For example, the multiplexer circuits 258, 260, 262a, 262p, 264, 266a and 266p generally perform DIM-driven switching where, for horizontal snakes signals go straightforwardly down and for vertical snakes k leftmost signals are swapped with remaining s–k signals. In general, editing-based duplication of wires and multiplexer circuits occurs only in two positions (e.g., multiplexers 262a; 262p and 266a; 266p). The XOR gates 268, 270, 272a, 272p, 274, 276a and 276p generally generate the signals $z_{s-1}, \ldots, z_0$. The ports are then separated and the address validity signals VALID_a and VALID_p generated by the NAND gates 278 and 280, respectively. The example in FIG. 17 generally illustrates comparison of 5-bit addresses with a constant 24. In one example in FIG. 17, the resulting signals VALID_a and VALID_p do not depend on inputs EDIT_A and EDIT_P, so the same comparator may be shared for both ports.

While the invention has been particularly shown and described with reference to the preferred embodiments thereof, it will be understood by those skilled in the art that various changes in form and details may be made without departing from the scope of the invention.

The invention claimed is:

1. A memory collar comprising:
    a first circuit configured to generate an address editing control signal, a trajectory control signal and a differential index control signal in response to one or more test commands;
    a second circuit configured to generate a base index signal in response to said differential index control signal and said base index signal; and
    a third circuit configured to generate one or more address sequences in response to said address editing control signal, said trajectory control signal, and said base index signal, wherein said one or more address sequences are presented to a memory during a test mode.

2. The memory collar according to claim 1, further comprising:
    a response analyzer configured to pre-process one or more outputs received from said memory; and
    a transport portion configured to (i) communicate said one or more test commands from a controller to said first circuit and (ii) communicate a result of pre-processing said one or more outputs of said memory to said controller.

3. The memory collar according to claim 1, wherein:
    said first circuit comprises an address command decoder;
    said second circuit comprises an index shuttle logic and a storage element; and
    said third circuit comprises an address shuffling logic.

4. The memory collar according to claim 3, wherein said index shuttle logic comprises:
    a correction expander circuit configured to generate a plurality of expanded register control signals in response to said differential index control signal; and
    an arithmetic circuit configured to modify said base index signal based upon said plurality of expanded control signals.

5. The memory collar according to claim 1, further comprising a register circuit configured to latch said trajectory control signal prior to presentation to said third circuit.

6. The memory collar according to claim 5, wherein:
said register is configured to store a trajectory.

7. The memory collar according to claim 1, wherein said third circuit is further configured to generate one or more address validity signals.

8. The memory collar according to claim 1, further comprising:
a memory test socket and control block configured to generate one or more address selection control signals in response to said one or more test commands; and
one or more multiplexer circuits configured to select between an active address and a passive address in response to said one or more address selection control signals.

9. The memory collar according to claim 1, wherein said memory collar is coupled with a controller to form a memory built-in self test (MBIST) chain.

10. An apparatus comprising:
a controller configured to generate one or more test commands;
one or more memory collars, each memory collar coupling a respective memory to said controller and configured to (i) generate one or more address sequences in response to an address editing control signal, a trajectory control signal, and a base index signal, wherein (a) said base index signal is generated in response to a differential index control signal and said base index signal and (b) said address editing control signal, said trajectory control signal, and said differential index control signal are based upon said one or more test commands, and (ii) pre-process one or more outputs generated by the respective memory in response to said one or more address sequences, wherein said address sequences are presented to said respective memory during a test mode.

11. The apparatus according to claim 10, further comprising a terminator block coupled to said one or more memory collars.

12. A method to control addresses in a memory built-in self test (MBIST) chain comprising:
generating a differential index control signal, a trajectory control signal and one or more address editing control signals in response to one or more test commands;
generating a current base index value based on a previous base index value in response to said differential index control signal;
generating one or more address sequences in response to said one or more address editing control signals, said trajectory control signal and said current base index value;
presenting said one or more address sequences to a memory during a test mode.

13. The method according to claim 12, further comprising:
controlling one or more ports of said memory according to said one or more address sequences.

14. The method according to claim 13, further comprising:
generating a plurality of addresses to test one or more ports of said memory.

15. The method according to claim 14, further comprising:
generating one or more address validity signals in response to said plurality of addresses and a predetermined constant value.

16. The method according to claim 12, wherein said differential index control signal comprises a pair of single-bit control signals encoding an instruction for generating said current base index value from said previous base index value.

17. The method according to claim 16, further comprising:
generating sign and magnitude control signals in response to said instruction.

18. The method according to claim 16, further comprising:
generating two's complement control signals in response to said instruction.

19. The method according to claim 12, further comprising:
communicating said test commands from a controller to a plurality of memory collars via a transport pipeline.

20. The method according to claim 12, further comprising:
communicating results of pre-processing one or more outputs generated by a plurality of memories in response to said one or more address sequences from a plurality of memory collars to a controller via a transport pipeline.

21. The method according to claim 12, wherein:
the trajectory control signal comprises a first trajectory-setting signal configured to indicate whether to use a fast row or fast column trajectory, a second trajectory-setting signal configured to indicate whether to use a forward or backward walk, and a third trajectory-setting signal configured to indicate whether to ignore said first and said second trajectory-setting signals;
the differential index control signal is configured to indicate how a current location is to be changed; and
the address editing control signal comprises a plurality of port control signals, each port control signal configured to indicate whether a corresponding address signal points to a current location or a dual location.

22. The apparatus according to claim 1, wherein:
the trajectory control signal comprises a first trajectory-setting signal configured to indicate whether to use a fast row or fast column trajectory, a second trajectory-setting signal configured to indicate whether to use a forward or backward walk, and a third trajectory-setting signal configured to indicate whether to ignore said first and said second trajectory-setting signals;
the differential index control signal is configured to indicate how a current location is to be changed; and
the address editing control signal comprises a plurality of port control signals, each port control signal configured to indicate whether a corresponding address signal points to a current location or a dual location.

* * * * *